(12) United States Patent  
Kare et al.

(10) Patent No.: US 12,379,520 B2  
(45) Date of Patent: Aug. 5, 2025

(54) LIGHT CURTAIN SAFETY SYSTEM

(71) Applicant: LaserMotive, Inc., Kent, WA (US)

(72) Inventors: Jordin T. Kare, San Jose, CA (US); Thomas J. Nugent, Bellevue, WA (US); David Bashford, Kent, WA (US); Carsten Casey Erickson, Kent, WA (US); Thomas W. Bashford, Renton, WA (US)

(73) Assignee: LaserMotive, Inc., Kent, WA (US)

( * ) Notice: Subject to any disclaimer, the term of this patent is extended or adjusted under 35 U.S.C. 154(b) by 38 days.

(21) Appl. No.: 18/402,639

(22) Filed: Jan. 2, 2024

(65) Prior Publication Data

US 2024/0310553 A1  Sep. 19, 2024

Related U.S. Application Data

(63) Continuation of application No. 17/896,882, filed on Aug. 26, 2022, now Pat. No. 11,899,160, which is a (Continued)

(51) Int. Cl.
 *G01V 8/22* (2006.01)
 *G01S 7/00* (2006.01)
 (Continued)

(52) U.S. Cl.
 CPC .............. *G01V 8/22* (2013.01); *G01S 7/003* (2013.01); *G01S 7/006* (2013.01); *G01S 7/484* (2013.01);
 (Continued)

(58) Field of Classification Search
 CPC .. G01V 8/22; H02J 50/90; H02J 50/10; H02J 50/30; H02J 50/60; G01S 17/04;
 (Continued)

(56) References Cited

U.S. PATENT DOCUMENTS 5,004,908 A  4/1991 Nakamura
9,312,701 B1  4/2016 Mor et al.
(Continued)

FOREIGN PATENT DOCUMENTS

EP  0 329 083 A2  8/1989
EP  1 469 617 A2  10/2004
(Continued)

OTHER PUBLICATIONS

International Search Report, mailed Jul. 20, 2016, for International Application No. PCT/US2016/033139, 3 pages.
(Continued)

*Primary Examiner* — Georgia Y Epps
*Assistant Examiner* — Don J Williams
(74) *Attorney, Agent, or Firm* — Seed IP Law Group LLP

(57) ABSTRACT

A system to detect obstacles includes a power beam transmission circuit, a power beam reception circuit arranged to receive a power beam from the power beam transmission circuit, an emitter module, and a detector module arranged to distinguish between a first characteristic and a second characteristic. The emitter module includes a first emitter arranged to emit a first signal having the first characteristic, the first signal emitted in proximity to the power beam, and a second emitter arranged to emit a second signal having the second characteristic, the second characteristic different from the first characteristic. The detector module includes a first detector arranged to respond to the first signal emitted by the first emitter, the detector module being arranged to determine when an obstacle is in or near a line-of-sight transmission path between the first emitter and the first detector.

22 Claims, 14 Drawing Sheets

Related U.S. Application Data continuation of application No. 17/074,488, filed on Oct. 19, 2020, now Pat. No. 11,442,195, which is a continuation of application No. 15/574,657, filed as application No. PCT/US2016/033141 on May 18, 2016, now Pat. No. 10,816,694.

(60) Provisional application No. 62/163,307, filed on May 18, 2015.

(51) Int. Cl.

| | | |
|---|---|---|
| *G01S 7/484* | (2006.01) | |
| *G01S 17/04* | (2020.01) | |
| *G01S 17/06* | (2006.01) | |
| *G01S 17/87* | (2020.01) | |
| *G01S 17/88* | (2006.01) | |
| *G01S 17/89* | (2020.01) | |
| *H01S 5/00* | (2006.01) | |
| *H01S 5/062* | (2006.01) | |
| *H01S 5/42* | (2006.01) | |
| *H02J 50/10* | (2016.01) | |
| *H02J 50/30* | (2016.01) | |
| *H02J 50/60* | (2016.01) | |
| *H02J 50/90* | (2016.01) | |
| *H04B 10/114* | (2013.01) | |
| *H04B 10/80* | (2013.01) | |

(52) U.S. Cl.
CPC .............. *G01S 17/04* (2020.01); *G01S 17/06* (2013.01); *G01S 17/87* (2013.01); *G01S 17/88* (2013.01); *G01S 17/89* (2013.01); *H01S 5/005* (2013.01); *H01S 5/0085* (2013.01); *H01S 5/06216* (2013.01); *H01S 5/423* (2013.01); *H02J 50/10* (2016.02); *H02J 50/30* (2016.02); *H02J 50/60* (2016.02); *H02J 50/90* (2016.02); *H04B 10/1141* (2013.01); *H04B 10/807* (2013.01)

(58) Field of Classification Search
CPC .......... G01S 7/003; G01S 7/006; G01S 7/484; G01S 17/06; G01S 17/87; G01S 17/88; G01S 17/89; H01S 5/005; H01S 5/0085; H01S 5/06216; H01S 5/423; H04B 10/1141; H04B 10/807
See application file for complete search history.

(56) References Cited

U.S. PATENT DOCUMENTS

| | | |
|---|---|---|
| 9,838,143 B2 | 12/2017 | Chan et al. |
| 9,912,379 B2 | 3/2018 | Hyde et al. |
| 10,816,694 B2 | 10/2020 | Kare et al. |
| 2002/0046763 A1 | 4/2002 | Berrios et al. |
| 2003/0016426 A1 | 1/2003 | Seong |
| 2003/0075670 A1 | 4/2003 | Tuominen |
| 2004/0156400 A1 | 8/2004 | Caplan et al. |
| 2004/0266367 A1 | 12/2004 | Tuominen et al. |
| 2007/0001822 A1 | 1/2007 | Haug |
| 2010/0044414 A1 | 2/2010 | Charbel et al. |
| 2012/0068055 A1 | 3/2012 | Burger et al. |
| 2012/0314410 A1 | 12/2012 | Leard |
| 2016/0178794 A1* | 6/2016 | Rollins ............... G01V 8/20 250/205 |

FOREIGN PATENT DOCUMENTS

| | | |
|---|---|---|
| EP | 1 871 021 A2 | 12/2007 |
| EP | 2 317 347 A2 | 5/2011 |
| EP | 2492714 A1 | 8/2012 |
| WO | 2005/101704 A1 | 10/2005 |

OTHER PUBLICATIONS

International Search Report, mailed Jul. 25, 2016, for International Application No. PCT/US2016/033141, 4 pages.

International Search Report, mailed Oct. 24, 2016, for International Application No. PCT/US2016/033120, 5 pages.

* cited by examiner

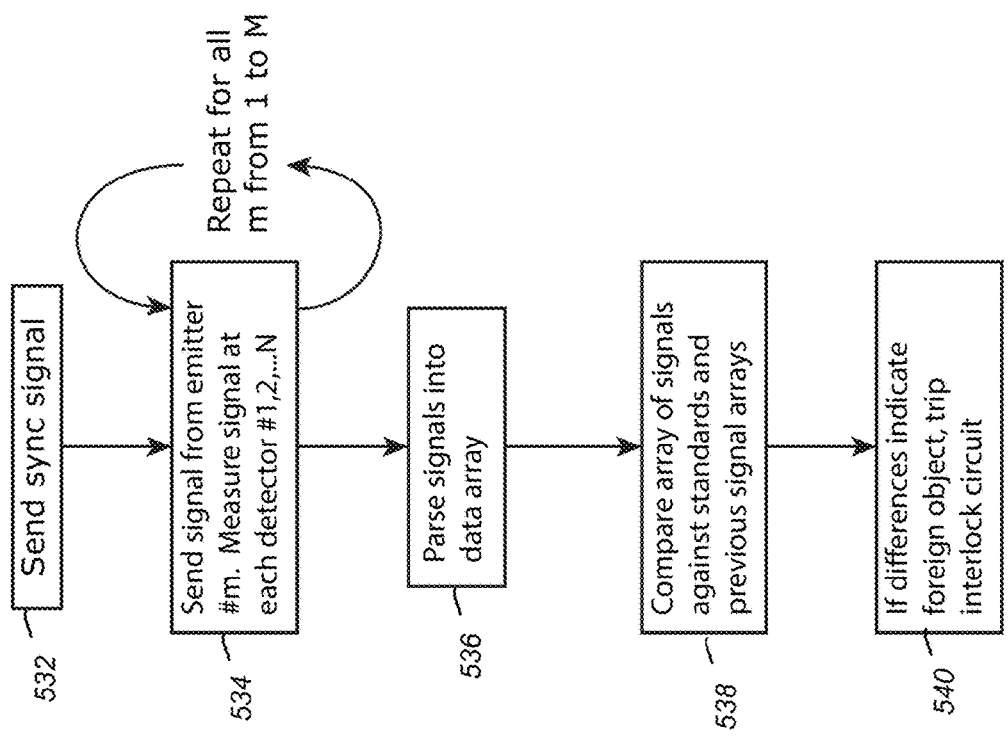

LIGHT CURTAIN SAFETY SYSTEM

CROSS-REFERENCE TO RELATED APPLICATION

This application is a continuation of U.S. patent application Ser. No. 17/896,882, filed Aug. 26, 2022, entitled "LIGHT CURTAIN SAFETY SYSTEM," which is a continuation of U.S. patent application Ser. No. 17/074,488, filed on Oct. 19, 2020, entitled "LIGHT CURTAIN SAFETY SYSTEM," which is a continuation of U.S. patent application Ser. No. 15/574,657, filed on Nov. 16, 2017, entitled "LIGHT CURTAIN SAFETY SYSTEM," which is a U.S. National Stage of PCT/US2016/033141 filed May 18, 2016, which claims the benefit under 35 U.S.C. § 119(e) of U.S. Provisional Patent Application No. 62/163,307, filed on May 18, 2015, entitled "Provisional Patents for Wireless Power" which is hereby incorporated by reference in its entirety.

BACKGROUND

Technical Field

The present disclosure generally relates to detection of objects in or around a hazardous area. More particularly, but not exclusively, the present disclosure relates to a light curtain safety system around a high-flux power beam or field.

Description of the Related Art

One form of remote power is a laser power beaming system. A laser power beaming system, also called an optical wireless power system, includes at least one transmitter and at least one corresponding receiver. The transmitter forms a high-flux beam of laser light, which is projected through the air over a distance toward the receiver.

In conventional laser power beaming systems, the transmitter has a laser assembly that converts electric power into optical power (i.e., light), which is often in the near-infrared (NIR) portion of the optical spectrum (i.e., having a wavelength between 0.7 and 2.0 µm). One or more mutually coherent or incoherent lasers in the laser assembly are used to generate the optical power; however, the one or more lasers may also be replaced by one or more light emitting diodes (LEDs), super-radiant diodes, or some other high-intensity light source. The light output of the laser assembly passes through various optical elements (e.g., optical fibers, lenses, mirrors, etc.), which convert the raw laser light into a beam of desired size and shape, and which aim the light beam toward the receiver. After leaving the transmitter, the high-flux light beam travels through free space toward the receiver.

The receiver, which may be in a remote area having an absence of easily available power, has a light reception module to receive the high-flux beam of laser light. At the receiver, light from the high-flux optical beam is captured by the light reception module. Power from the high-flux optical beam is captured, either directly or via collecting optics such as lenses or mirrors, and converted at least partly back to another form of useful power. In some cases, the light reception module includes an array of photovoltaic (PV) cells which convert light to direct current (DC) electricity. In other cases, the light reception module converts light to electricity in other ways, for example by converting the optical power to heat, which drives a heat engine (e.g., Stirling engine, turbine), a thermoelectric device, or some other device. In cases where the laser light is converted to usable electric power, the electric power is stored or transported to one or more circuits where the power is consumed.

The dangers of high-flux laser light are addressed in various U.S. and international standards. For example, in ANSI Z136.1, a laser eye exposure hazard is defined as being a function of the laser wavelength, flux (in $W/cm^2$), pulse width, and the apparent angular size (AAS) of the source. Accordingly, it is known that in some power beaming systems, the optical high-flux power beam is above the safe limit for exposure to living tissue such as a human or animal eye. In addition to eye or other tissue damage, the high-flux power beam may also cause burns or other damage to non-living objects. For these reasons, known power beaming systems may try to detect when people, animals, or other objects are in or will imminently enter the high-flux beam path during the time the beam is activated.

In some cases, a "light curtain" is used to detect objects moving in proximity to a high-flux power beam. The light curtain includes one or more light sources (i.e., emitters) arranged around a high-flux power beam transmitter to direct light across a gap towards one or more detectors arranged around the power beam receiver. The light curtain also includes a control circuit that provides a binary (e.g., "go/no-go") output. The control circuit provides a "go" output if each detector in the light curtain is illuminated by a light source. The control circuit provides a "no-go" output if light is blocked from reaching one or more detectors, which will happen when an opaque object such as a human hand enters the area between the light source and the light detector.

In the known light curtain, each detector monitors a single line-of-sight light path from one light source, and the controller is configured to respond only if that path is blocked. In some cases, the controller provides additional outputs, for example indicating a large size or location of the object based on the number of light paths that are blocked, or based on which particular light path is blocked.

Emitters in the light curtain emit light at a specific wavelength or in a specific wavelength range. In some cases, the light from the emitters is also pulsed at a particular rate. In these light curtains, the detection system includes one or more filters that permit the detector to ignore light signals that are different from the selected wavelength or outside of the selected wavelength range. In this way, the known light curtain will not respond to steady light sources, such as sunlight, or light modulated with an incorrect frequency or pattern such as fluorescent light sources which flicker at 120 Hz.

U.S. Pat. No. 7,078,666 to Tuominen teaches a variant of a standard light curtain, which is described as a "virtual insulator." In Tuominen, low power light sources are located around a high power transmitter, and low power light detectors are located around a high power receiver. In this way, the virtual insulator is configured to surround a high-power laser beam. The virtual insulator of Tuominen uses multiple light sources with individual detectors, and Tuominen pulses her light sources and logically combines the detector outputs such that if any one detector differs in its light-detected/light-not-detected state from other detectors, the high power beam is deactivated.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

The present disclosure is directed toward high-flux power beam safety system technology. In such safety systems, a plurality of guard beams form a light curtain around the high-flux power beam, wherein each guard beam is provided by at least one emitter and a corresponding detector. In some cases, there is a one-to-one relationship wherein one emitter emits a guard beam detected by one and only one detector; in some cases, there is a one-to-many relationship wherein one emitter emits one or more guard beams that are detected by two or more detectors; in some cases, there is a many-to-one relationship wherein many emitters each emit a one or more guard beams that are detected by one same detector; and in some cases, there is a many-to-many relationship wherein two or more emitters pass one or more guard beams to two or more detectors;

In some embodiments, the problem of receiving a guard beam light signal at a detector from a non-corresponding emitter, which masks detection of a foreign object intruding into the line-of-sight path between the detector and its corresponding emitter, is solved by providing a means of distinguishing the guard beam light signal of one emitter from the guard beam light signal of another emitter.

In some embodiments, the problem of providing power at a high-flux power beam receiver in order to operate the emitters or detectors of a light curtain safety system before the high-flux power beam is activated (said power from the high-flux power beam being necessary at the receiver in order to operate the light curtain safety system), is solved by co-locating guard beam emitters and guard beam detectors in close proximity to each other near the high-flux power beam transmitter and extending the line-of-sight guard beam path to include two guard beam sub-paths: a first sub-path from the emitter (E) to a retro-reflector (RR) and a second sub-path from the RR to the detector (D).

In some embodiments, the problem of a light-reflective foreign object intruding into the line-of-sight path between a guard beam emitter and its corresponding detector and reflecting the guard beam back to the detector thereby masking detection of the light-reflective foreign object is solved by a plurality of guard beams having different wavelengths; the different wavelengths selected for their different absorptive properties.

In some embodiments, the problem of a light-transparent foreign object intruding into the line-of-sight path between a guard beam emitter and its corresponding detector and not blocking passage of the guard beam thereby masking detection of the light-transparent foreign object is solved by a plurality of guard beams having different wavelengths; the different wavelengths selected for their different absorptive properties.

A first embodiment of the inventive concepts described herein is directed to a system to detect obstacles. The system includes a power beam transmission circuit, a power beam reception circuit arranged to receive a power beam from the power beam transmission circuit, an emitter module, and a detector module arranged to distinguish between a first characteristic and a second characteristic. In the system, the emitter module includes a first emitter arranged to emit a first signal having the first characteristic, the first signal emitted in proximity to the power beam, and a second emitter arranged to emit a second signal having the second characteristic. The second characteristic is distinguishable or otherwise different from the first characteristic, and the second signal is emitted in proximity to the first signal. Also in the system, the detector module includes a first detector arranged to respond to the first signal emitted by the first emitter, wherein the detector module is arranged to determine when an object is impinging on the power beam (e.g., near or impeding the power beam such as when an obstacle is in or near a line-of-sight transmission path between the first emitter and the first detector).

In some cases of the first embodiment, the detector module includes a second detector arranged to respond to the second signal emitted by the second emitter, wherein the detector module is arranged to further determine when an object is impinging on the power beam (e.g., near or impeding the power beam such as when an obstacle is in or near a line-of-sight transmission path between the second emitter and the second detector). In some cases, the first emitter includes at least one light emitting diode (LED), at least one laser light source, at least one fluorescent light source, or at least one incandescent light source, and in some cases, the first signal includes at least one of a visible light signal, an infrared light signal, and an ultraviolet light signal. The first characteristic in the first embodiment may include a color, an emission wavelength, a pattern of emission wavelengths to allow for an "m-of-n-wavelengths" case, or a spectral distribution (e.g., an optical filter, an algorithmic filter to distinguish wavelength, or the like). In the system of the first embodiment, the first detector may include at least one photodiode, at least one phototransistor, at least one photomultiplier tube, at least one avalanche photodiode, at least one charge-coupled device (CCD) imaging sensor, at least one complementary metal-oxide semiconductor (CMOS) imaging sensor, or at least one bolometric detector (e.g., to detect thermal IR signals). In some cases, the first emitter includes at least one directional acoustic source, and here, the first characteristic includes an emission frequency. The first detector may include at least one microphone, at least one microphone array, at least one ultrasonic transducer, or at least one ultrasonic transducer array.

In some cases of the first embodiment, the first signal is a pulsed signal, and the first characteristic includes a pulse rate, and in other cases, the first signal is a pulsed signal, and the first characteristic includes a pulse time delay; wherein the pulse time delay is representative of a delay from a reference time, and wherein the reference time is determined from at least one of an emitted time reference signal and a shared time reference value (e.g., GPS). The second signal in these cases may be a pulsed signal pulsed at a same rate as the first signal, wherein the second characteristic includes a second pulse time delay different from the first pulse time delay.

In some cases of the first embodiment, the first signal is a modulated signal, and the first characteristic includes a modulation frequency. In some cases, the first signal is an encoded light signal, the encoded light signal modulated with signal code, and the first characteristic includes a representation of the signal code. In some cases the first detector is arranged to generate a first detection signal in response to a detected signal having the first characteristic; in some cases, the first detector is arranged to generate a first detection signal in response to a detected signal having either the first characteristic or the second characteristic, and in some cases, the detector module is arranged to generate a first detection signal in response to a detected signal having the first characteristic, and the detector module is further arranged to generate a second detection signal in response to the detected signal having the second characteristic. Here, the first detection signal and the second detection signal are different detection signals, and the detector module may be controllable to select whether the first detection signal is generated in response to the detected signal having the first characteristic or whether the first detection signal is generated in response to the detected signal having the second characteristic. In still other cases, the line-of-sight transmission path may include two or more reflective structures, each of the two or more reflective structures arranged to re-direct signals that reach said reflective structure.

A second embodiment of the inventive concepts described herein includes a safety system to form an optical fence around a power beam propagated from a power beam transmission circuit toward a power beam reception circuit. The safety circuit includes a plurality of M emitters, each emitter arranged to emit a first emission signal to a respective a plurality of N detection modules, each detection module arranged to respond to emission signals emitted from at least one of the M emitters, wherein each detection module includes at least one detector positioned in a line-of-sight of at least one emitter, and wherein each detection module is arranged to determine when an object is impinging on the power beam (e.g., near or impeding the power beam such as when an obstacle or object is interfering with a line-of-sight transmission path between the at least one emitter and the at least one detector), the determination based at least in part on a distinguishable characteristic of the first emission signal or a distinguishable characteristic of the second emission signal. The safety circuit also includes a controller coupled to the plurality of N detection modules, the controller configured to assert an output representing a safe condition or an unsafe condition based at least in part on determination information from the plurality of N detection modules.

In some cases of the second embodiment, the at least one detector of each of the plurality of detection modules includes a plurality of detectors, each detector positioned in a line-of-sight of at least one other detector of a same respective detection module, each of the plurality of N detection modules arranged to combine detection information from each of the plurality of detectors to generate the determination information. In some cases, the safety system includes a retro-reflector, wherein the at least one detector is positioned proximate to the at least one emitter, and wherein the line-of-sight includes the retro-reflector. The safety system includes a mirror, wherein the at least one detector is positioned proximate to the at least one emitter, and wherein the line-of-sight includes the mirror. In some cases the safety system includes a diffusely reflective surface, wherein the at least one detector is positioned proximate to the at least one emitter, and wherein the line-of-sight includes the diffusely reflective surface.

In the safety system according to the second embodiment, at least one emitter and a corresponding detector are positioned proximate to each other, wherein one or more lines of sight include a retro-reflector. In some cases, the response to emission signals by the plurality of N detectors includes a binary output from each of the plurality of N detectors indicating a presence or absence of line-of-sight blockage. In some cases of the second embodiment, the response to emission signals by the plurality of N detectors includes a plurality of binary outputs from each of the plurality of N detectors indicating a presence or absence of line-of-sight blockage and, in some cases, the response to emission signals by the plurality of N detectors includes one or more outputs indicating at least one condition associated with a line-of-sight path between an emitter and a detector.

The safe condition or unsafe condition in some cases of the second embodiment is based on real time determination information from the plurality of N detection modules, and in other cases, it is based on determination information collected over time from the plurality of N detection modules. The safe condition or unsafe condition may be based on a probabilistic estimate generated by the controller, or the safe condition or unsafe condition may be based on a comparison of the probabilistic estimate to a selected threshold.

In some cases of the second embodiment, M is an integer greater than or equal to 2 and N is an integer greater than or equal to 1; in some cases, M is an integer greater than or equal to 4 and N is an integer greater than or equal to 2; and in some cases, M is an integer greater than or equal to 8 and N is an integer greater than or equal to 4.

In cases of the second embodiment where the response to emission signals by the plurality of N detectors includes a plurality of binary outputs from each of the plurality of N detectors indicating a presence or absence of line-of-sight blockage, the plurality of binary outputs may include one output per line-of-sight transmission path, and in other cases the plurality of binary outputs includes a first output to indicate a single line-of-sight transmission path is blocked and a second output to indicate a plurality of line-of-sight transmission paths are blocked.

In cases of the second embodiment where the response to emission signals by the plurality of N detectors includes one or more outputs indicating at least one condition associated with a line-of-sight path between an emitter and a detector, the one or more outputs may include at least one multi-bit output, and the one or more outputs may indicate at least of one a plurality of line-of-sight transmission paths are blocked, a reduced signal strength of a detected emitter and signal, a degree of line-of-sight transmission path blockage, a duration of line-of-sight transmission path blockage, a time since a beginning of a line-of-sight transmission path blockage, and a time since and end of a line-of-sight transmission path blockage.

A third embodiment of the inventive concepts described herein includes a power beam safety system and method, which includes the acts of emitting at least one of two emission signals from each of a plurality of emitters, the two emission signals distinguishable from each other; detecting one or both of the two emission signals with at least one detector of a detection module, the detection module arranged to distinguish between the two emission signals; and determining that a decrease in the detection of the one or both of the two emission signals is caused by an obstacle in a line-of-sight path between a first emitter of the plurality of emitters and a first detector of the detection module.

A fourth embodiment of the inventive concepts described herein includes a method of operating an optical "fence" formed around a power beam propagated from a power beam transmission circuit toward a power beam reception circuit. The method includes the act of emitting a first emission signal from at least one first emitter; emitting a second emission signal from at least one second emitter, the first and second emission signals distinguishable from each other; and positioning a detection module to receive the first and second emission signals, the detection module having at least one detector in line-of-sight of the at least one first emitter, the at least one second emitter, or the at least one first emitter and the at least one second emitter. The method also includes the acts of determining with the detection module that at least a portion of the line-of-sight has been blocked; and generating an object-detection output based on the determination that the line-of-sight has been blocked.

A fifth embodiment of the inventive concepts described herein includes an object detecting system. The object detecting system includes an optical emitter arranged to emit light at a first wavelength $\lambda_1$ and a second wavelength $\lambda_2$; an optical detector arranged to separately detect intensities of light at the first and second wavelengths $\lambda_1$ and $\lambda_2$; and a reflector positioned to reflect at least a portion of light emitted by the optical emitter toward the optical detector, the reflector having a first reflective property of light at the first wavelength $\lambda_1$ and a second reflective property of light at the second wavelength $\lambda_2$, the first reflective property different from the second reflective property. The object detecting system also includes a controller arranged to detect an object in an optical path between the optical emitter and the optical detector, the detection based on one or more of a change in a detected intensity of light at either the first wavelength $\lambda_1$ or the second wavelength $\lambda_2$ and a change in relative detected intensities of light at the first wavelength $\lambda_1$ and the second wavelength $\lambda_2$.

In some cases of the fifth embodiment, the first wavelength $\lambda_1$ and the second wavelength $\lambda_2$ differ by less than a factor of 1.5, and in other cases the first wavelength $\lambda_1$ and the second wavelength $\lambda_2$ differ by less than a factor of 1.1. In some cases of the fifth embodiment, the first wavelength $\lambda_1$ and the second wavelength $\lambda_2$ each include a wavelength band having a lower wavelength and an upper wavelength. In some cases of the fifth embodiment, the wavelength band of the second wavelength $\lambda_2$ is a subset of the wavelength band of the first wavelength $\lambda_1$. In these and other cases of the fifth embodiment, the first wavelength $\lambda_1$ and the second wavelength $\lambda_2$ are between 360 nanometers and 1600 nanometers.

The optical emitter in some cases of the fifth embodiment includes a single light source arranged to emit light over a range that includes the first wavelength $\lambda_1$ and the second wavelength $\lambda_2$. In these cases, a transmitter filter assembly may be positioned to pass light at the first wavelength $\lambda_1$ and the second wavelength $\lambda_2$, the transmitter filter assembly arranged to block light having a wavelength different from the first wavelength $\lambda_1$ and the second wavelength $\lambda_2$. In these cases of the fifth embodiment the single light source may include at least one of an incandescent light source, a fluorescent light source, a light-emitting diode (LED), an LED device having at least two light-emitting diodes, an LED device having at least one light-emitting diode and at least one phosphor, a broadband laser, an amplified spontaneous emission source, a laser device having two or more individual laser emitters, and a laser device having at least one laser emitter and at least one phosphor. Also in some of these cases of the fifth embodiment, the object detecting system may include a transmitter filter assembly arranged to alternately pass light at the first wavelength $\lambda_1$ and light at the second wavelength $\lambda_2$, wherein the controller is arranged to distinguish between an intensity of light having the first wavelength $\lambda_1$ detected when light at the first wavelength $\lambda_1$ is passed from an intensity of light having the second wavelength $\lambda_2$ detected when light at the second wavelength $\lambda_2$ is passed. In these cases, the transmitter filter assembly may include at least two filters and a mount arranged to receive the at least two filters, the mount further arranged to rotate the at least two filters, oscillate the at least two filters, or reciprocate ones of the at least two filters relative to each other. The transmitter filter assembly may include at least one electronically switchable filter.

In some cases of the fifth embodiment, the optical emitter of the object detecting system includes a first light source to emit the light at the first wavelength $\lambda_1$, and a second light source to emit the light at the second wavelength $\lambda_2$. In these cases, the light at the first wavelength $\lambda_1$ and the light at the second wavelength $\lambda_2$ may be optically combined into a single light output. In these cases, the first light source and the second light source may be arranged to emit the light at the first wavelength $\lambda_1$ and the light at the second wavelength $\lambda_2$ as substantially parallel light beams. In these cases, the light at the first wavelength $\lambda_1$ and the light at the second wavelength $\lambda_2$ may be alternately output wherein the controller is arranged to distinguish an intensity of the light at the first wavelength $\lambda_1$ from an intensity of the light at the second wavelength $\lambda_2$. In these cases, the first light source may emit the light at the first wavelength $\lambda_1$ in a first pulse pattern, and the second light source may emit the light at the second wavelength $\lambda_2$ in a second pulse pattern, wherein the controller may be arranged to distinguish between detected pulses of the light at the first wavelength $\lambda_1$ and detected pulses of the light at the second wavelength $\lambda_2$. In these cases, the first light source may emit the light at the first wavelength $\lambda_1$ in a first pulse pattern, and the controller may be arranged to distinguish between detected pulses of the light at the first wavelength $\lambda_1$ and light at the second wavelength $\lambda_2$ detected between pulses of the light at the first wavelength $\lambda_1$. And in these cases, the first light source may emit the light at the first wavelength $\lambda_1$ according to a first modulation scheme, and the second light source may emit the light at the second wavelength $\lambda_2$ according to a second modulation scheme, wherein the optical detector may be arranged to demodulate a received composite light signal and extract an intensity of the light at the first wavelength $\lambda_1$ and the intensity of the light at the second wavelength $\lambda_2$.

In some cases of the fifth embodiment, the optical detector includes a first detector to respond to light at the first wavelength $\lambda_1$, and a second detector to respond to light at the second wavelength $\lambda_2$. A first detector in the object detecting system may include at least one photodiode, at least one phototransistor, at least one photomultiplier tube, or at least one avalanche photodiode, and an optical detector may include a single detector and filter assembly arranged to alternately pass light at the first wavelength $\lambda_1$ and light at the second wavelength $\lambda_2$. In some of these cases, the single detector and filter assembly include at least two filters and a mount arranged to receive the at least two filters, the mount further arranged to rotate the at least two filters, oscillate the at least two filters, or reciprocate ones of the at least two filters relative to each other. The single detector and filter assembly in some of these cases may include at least one electronically switchable filter, or the single detector and filter assembly may include at least one photodiode, at least one phototransistor, at least one photomultiplier tube, or at least one avalanche photodiode.

In some cases of the fifth embodiment an aperture of the optical emitter is positioned in close proximity to an aperture of the optical detector. In some cases, at least one beam splitter is positioned to superimpose an aperture of the optical emitter on an aperture of the optical detector. In some cases, a reflector includes at least one specular reflector, and here in some cases, the at least one specular reflector includes a dichroic mirror. In some other cases, a reflector includes a wavelength selective filter, at least one discrete retro-reflector, or at least one retro-reflective surface.

In some cases of the object detecting system of the fifth embodiment, the controller is arranged to determine that the detected object in the optical path between the optical emitter and the optical receiver is a non-reflective object based on at least one of a decrease in intensity of light at the first wavelength $\lambda_1$ and a decrease in intensity of light at the second wavelength $\lambda_2$. In some other cases, the controller is arranged to determine that the detected object in the optical path between the optical emitter and the optical receiver is a reflective object or a light-scattering object based on at least one of an increase in intensity of light at the first wavelength $\lambda_1$ and an increase in intensity of light at the second wavelength $\lambda_2$. In some cases, the controller is arranged to determine that the detected object in the optical path between the optical emitter and the optical receiver is a reflective object or a light-scattering object based on a change in a ratio of an intensity of light at the first wavelength $\lambda_1$ and an intensity of light at the second wavelength $\lambda_2$.

The object detecting system in some cases of the fifth embodiment includes at least one optical filter, wherein the optical emitter is arranged to emit the light at the first wavelength $\lambda_1$ at a selected pulse rate, wherein the optical emitter is arranged to emit the light at the second wavelength $\lambda_2$ at the selected pulse rate, and wherein the optical receiver is arranged to separately detect intensities of light at the first and second wavelengths $\lambda_1$ and $\lambda_2$ based on light that passes through the at least one optical filter. In other cases, the object detecting system includes at least one optical filter, wherein the optical emitter is arranged to emit the light at the first wavelength $\lambda_1$ at a selected modulation, wherein the optical emitter is arranged to emit the light at the second wavelength $\lambda_2$ at the selected modulation, and wherein the optical receiver is arranged to separately detect intensities of light at the first and second wavelengths $\lambda_1$ and $\lambda_2$ based on light that passes through the at least one optical filter.

A sixth embodiment of the inventive concepts described herein includes a method to prevent a false negative determination caused by reflected light in an object-detection system. The method includes the act of emitting, from a first aperture of an optical emitter, light at a first wavelength $1i$; emitting, from a second aperture of the optical emitter, light at a second wavelength $\lambda_2$; and detecting, with an optical detector, an intensity of light at the first wavelength $\lambda_1$. The method also includes the act of detecting, with the optical detector, an intensity of light at the second wavelength $\lambda_2$; reflecting from the optical emitter toward the optical detector, with a reflector, a first portion of light at the first wavelength $\lambda_1$; reflecting from the optical emitter toward the optical detector, with the reflector, a second portion of light at the second wavelength $\lambda_1$, wherein the first portion is distinguishably different from the second portion; and determining, based on the first portion and the second portion, that an object is in an optical path between the optical emitter and the optical detector. In some cases of the method, determining that the object is in the optical path includes determining that the object is a non-reflecting object based on a decrease in intensity of either or both light at the first wavelength $\lambda_1$ or light at the second wavelength $\lambda_2$. In some cases of the method, the act of determining that the object is in the optical path includes determining that the object is a reflective or optically scattering object based on a change in a ratio of intensity of light at the first wavelength $\lambda_1$ and light at the second wavelength $\lambda_2$.

In some cases of the embodiments described herein, a single filter is used; and in these cases an entire output of a source is treated as one wavelength, and a portion of the source passing through the filter is treated as a second wavelength. In some cases a dichroic is used to produce two substantially parallel light beams. In some cases, first, second, or first and second modulation schemes are orthogonal, use convolution codes, or perform a different type of modulation. In some cases, a beam splitter is included in the systems. For example, a polarizing beam splitter and quarter wave plates may be included. Retro-reflectors in some embodiments are discrete, and in other embodiments include retro-reflective tape or a retro-reflective layer. Retro-reflectors include corner cubes, cat's eye reflectors, continuous strips, or dots of material. In some embodiments, a signal detection is based on pre-set thresholds wherein a receiver is adjusted until it normally detects a first wavelength and just barely fails to detect a second wavelength. Alternatively, thresholds may be self-adjusting wherein a first threshold is set just below a low-pass-filtered average intensity for the last X seconds, and wherein a second threshold is set just above the low-pass-filtered average. Detectors in some cases may be set up with analog thresholds, such as using a comparator on the output of a photodiode, and detectors in other cases may include analog detectors, the output of which is digitized. In these cases, a controller can set a threshold digitally. In some cases an optical filter rejects continuous or low-frequency-modulated background light. In some cases, emitters and detectors are co-located.

A seventh embodiment of the inventive concepts described herein includes an object-detecting safety system. The object-detecting safety system includes a primary object-detecting safety system, a secondary object-detecting safety system, and a combiner. The primary object-detecting safety system is arranged to detect first objects in or near a first optical path, said first objects being effectively opaque at a first wavelength, wherein the first optical path is a line-of-sight transmission path between a first emitter and a first detector, wherein the first emitter is arranged to emit a first light signal at the first wavelength, and wherein the first detector is arranged to receive at least a portion of the first light signal at the first wavelength. The secondary object-detecting safety system is arranged to detect second objects in or near a second optical path, said second objects being substantially transparent at the first wavelength and said second objects being effectively opaque at a second wavelength, wherein the second optical path is a line-of-sight transmission path between a second emitter and a second detector, wherein the second emitter is arranged to emit a second light signal at the second wavelength, and the second detector is arranged to receive at least a portion of the second light signal at the second wavelength. The combiner is arranged to produce a common object-detection output from a first output generated by the primary object-detecting safety system and a second output generated by the secondary object-detecting safety system.

In some cases of the seventh embodiment, the first wavelength is between about 350 nanometers and 2500 nanometers, and in some cases, the second wavelength is between about 200 nanometers and about 350 nanometers. In some cases of the seventh embodiment, the second wavelength is in the UV-B band between about 290 nanometers and about 315 nanometers, and in some cases, the second wavelength is between about 2500 nanometers and about 10,000 nanometers. In still other cases of the seventh embodiment, the second wavelength is in the mid-infrared band between about 2800 nanometers and about 5000 nanometers.

The object-detecting safety system of the seventh embodiment may, in some cases, include a first reflective surface positioned remote to the first emitter and the first detector, wherein the first emitter is positioned in proximity to the first detector, and wherein the first optical path includes two first sub-paths, one first sub-path between the first emitter and the first reflective surface, and another first sub-path between the first reflective surface and the first-detector; and a second reflective surface positioned remote to the second emitter and the second detector, wherein the second emitter is positioned in proximity to the second detector, and wherein the second optical path includes two second sub-paths, one second sub-path between the second emitter and the second reflective surface, and another second sub-path between the second reflective surface and the second-detector. In some cases, the object-detecting safety system includes a first reflective surface positioned remote to the first emitter and the first detector, wherein the first emitter is positioned in proximity to the first detector, and wherein the first optical path includes two first sub-paths, one first sub-path between the first emitter and the first reflective surface, and another first sub-path between the first reflective surface and the first-detector; and in these cases the second emitter is positioned remote to the second detector.

In some cases of the seventh embodiment, the first emitter is positioned remote to the first detector, and the second emitter is positioned remote to the second detector. In some cases, the secondary object-detecting safety system has a lower spatial resolution than the primary safety system. In some cases of the seventh embodiment, the primary object-detecting safety system detects the first objects based on a first threshold, and the secondary object-detecting safety system detects the second objects based on a second threshold, the first threshold different from the second threshold. The common object-detection output in some cases of the seventh embodiment includes a logical OR of the first output generated by the primary object-detecting safety system and the second output generated by the secondary object-detecting safety system.

Considering the object-detecting safety system of the seventh embodiment, in some cases the common object-detection output includes a weighted combination of the first output generated by the primary object-detecting safety system and the second output generated by the secondary object-detecting safety system. In some cases the first objects being effectively opaque at the first wavelength includes first objects that absorb, reflect, diffuse, or scatter light in a range substantially about the first wavelength. In some cases, the first emitter is positioned in proximity to the second emitter. In other cases, the first emitter is positioned in proximity to the second detector.

An eighth embodiment of the inventive concepts described herein includes a method to prevent missing a detection of a transparent object in a light-curtain object-detection system. The method includes the act of generating a first output based on light of a first wavelength passed over a first optical path from a first emitter of a primary object-detecting safety system toward a first detector of the primary object-detecting safety system; generating a second output based on light of a second wavelength passed over a second optical path from a second emitter of a secondary object-detecting safety system toward a second detector of the secondary object-detecting safety system, wherein the transparent object is substantially transparent at the first wavelength and wherein the transparent object is substantially opaque at the second wavelength; and combining the first output and the second output to produce a common object-detection output. In some cases of the method, light of the first wavelength passed over the first optical path is coplanar to light of the second wavelength passed over the second optical path.

This Brief Summary has been provided to introduce certain concepts in a simplified form that are further described in detail below in the Detailed Description. Except where otherwise expressly stated, the summary is not intended to identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which:

FIG. 5C is a logical flow diagram generally showing a process to distinguish a first guard beam light signal from a second guard beam light signal;

DETAILED DESCRIPTION

Figure 1:
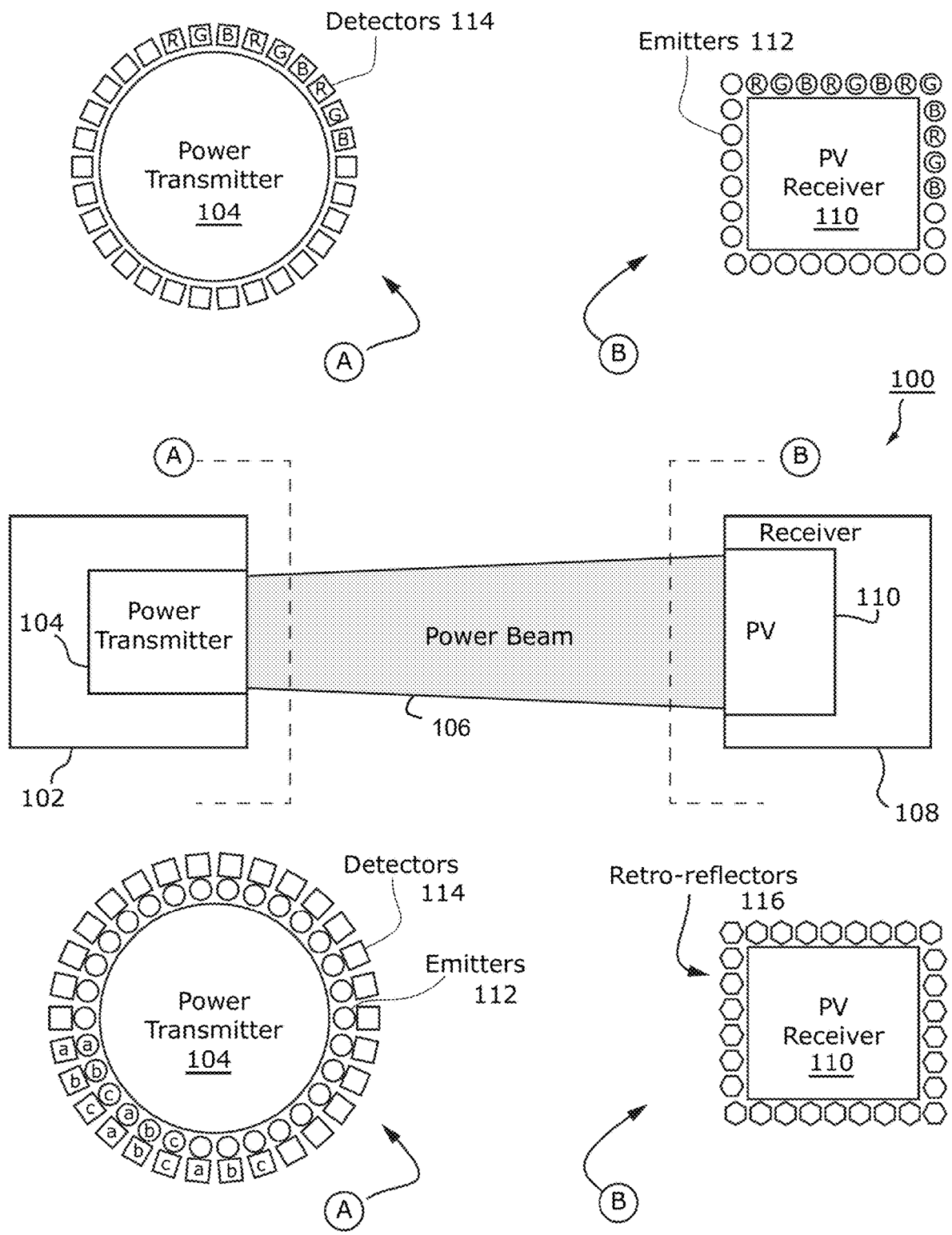
FIG. 1 is a power beaming system having exemplary arrangements of guard beam emitters and guard beam detectors.

The present application is related to the following applications filed on the same day as the present application, naming the same inventors, and assigned to the same entity; each of said applications incorporated herein by reference to the fullest extent allowed by law: U.S. patent application Ser. No. 15/574,655, entitled MULTI-LAYERED SAFETY SYSTEM, filed Nov. 16, 2017; U.S. patent application Ser. No. 15/574,659, entitled DIFFUSION SAFETY SYSTEM, filed Nov. 16, 2017; U.S. patent application Ser. No. 15/574,663, entitled POWER BEAMING VCSEL ARRANGEMENT, filed Nov. 16, 2017; U.S. patent application Ser. No. 15/574,667, entitled LOCATING POWER RECEIVERS, filed Nov. 16, 2017; U.S. patent application Ser. No. 15/574,668, entitled WIRELESS POWER TRANSMITTER RECEIVER, filed Nov. 16, 2017In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems including client and server computing systems, as well as networks have not been shown or described in detail to avoid unnecessarily obscuring descriptions of the embodiments.

Prior to setting forth the embodiments however, it may be helpful to an understanding thereof to first set forth definitions of certain terms that are used hereinafter.

The term "free space," as it is used in the present disclosure, means any reasonably transparent medium such as air or vacuum, water, gas, and the like. Free space is distinguished from a mechanical medium such as an optical fiber or conduit that confines or encloses a high flux light beam or field. Within the present disclosure, a free space path may include one or more mirrors, lenses, prisms, or other discrete optical elements that redirect or alter particular characteristics of the high flux light.

The term "power beam" is used, in all its grammatical forms, throughout the present disclosure and claims to refer to a high-flux light transmission that may include a field of light, that may be generally directional, and that may be arranged for steering/aiming to a suitable receiver. The power beams discussed in the present disclosure include beams formed by high flux laser diodes or other like sources sufficient to deliver a desirable level of power to a remote receiver without passing the power over a conventional electrical conduit such as wire.

In the present disclosure, the term "light," when used as part of a safety system such as a guard beam, refers to electromagnetic radiation including visible light, ultraviolet light, and mid- or short-wavelength infrared light. Shorter or longer wavelengths, including soft X-rays and thermal infrared, terahertz (THz) radiation, or millimeter waves, are also considered to be light within the present disclosure when such light can be reflected, blocked, attenuated, or otherwise used to detect obstacles of the sizes and compositions of interest.

The term "guard beam" refers to a light-based system deployed in proximity to a high-flux power beam and arranged as one or more portions of a safety system. The guard beam may be formed as a light beam or field at a power level that is comparatively low with respect to the high-flux power beam or some other hazardous region. The interruption of a guard beam may be used to indicate the presence of an unsafe object. The interruption of a guard beam may generate one or more control signals that are used to prevent, extinguish, disable, block, or otherwise control the high-flux power beam or other hazard. For example, interruption of a guard beam may generate a control signal used by a safety system to shut down a high-flux power beam transmitter. In some cases the guard beam may only be partially interrupted. For example, in some cases, one or more foreign objects may reflect light as a side reflection that is at the edges of the emitted sensor beam(s) or from sensor light that is scattered in the air. In other cases, the guard beam may be fully interrupted causing a direct reflection due to one or more foreign objects being completely between an emitter and a detector.

In the present disclosure, a source for a guard beam is referred to as an "emitter." The term emitter is distinguished from the term, "transmitter," which indicates a source of a high-flux power beam. An emitter may be any type of optical or infrared emitting device, including without limitation a laser or a light emitting diode (LED), or an emitter may be any other source of electromagnetic energy, such as a light, having a flux level lower than the high flux power beam and determined to be safe. Along these lines, the detection module for a guard beam includes a "detector." The term "detector" is distinguished from the term, "receiver," which indicates a reception module for a high-flux power beam. A detector may be any type of optical or infrared sensing device, including without limitation a photodiode, a phototransistor, an avalanche photodiode, a photomultiplier tube, a portion of a 1-D or 2-D array of sensors such as a CCD or CMOS image sensor, or any other circuit or device arranged to cooperatively detect signals from a corresponding emitter. A single array sensor may be configured to act as multiple detectors. Emitters and/or detectors may include various electronic, optical, mechanical, electromechanical, and other components in addition to a light source and a photodetector, respectively, and some of said components are not described herein for brevity.

The terms "impinge," "impinge on," and the like, as used in the present disclosure, may be understood to include a physical impact, an obstruction in a line of sight path, an interference with, an encroachment of, and to have an effect upon. Accordingly, physical contact or direct obstruction is not required for one element to impinge on another. Instead, a first element may impinge on a second element if the first element is detected or determined to have an actual or imminent effect on the second element, even if the first element is only near the second element. A non-exhaustive list of words that may interchangeably be used in addition to, in place of, or to better understand any of the grammatical forms of the word "impinge" include, as the context directs: obstruct, encroach, touch, trespass, invade, impede, enter, impose, interfere, intrude, violate, accroach, and obtrude.

The term "near," when used in the present disclosure in the context of, for example, a foreign object being "near" or impeding a guard beam, a high-flux power beam, or the like is a definite term of distance that is determinable based on a context of use. The term, however, is not subject to a formulistic or mathematically precise definition. For example, when a small-size, small-mass object (e.g., a bumble bee) is stationary or slowly moving toward a high-flux power beam, the small-size, small-mass object may be determined to be "near" the high-flux power beam when the object is within one or two inches of the high flux power beam. When the small-size, small-mass object is quickly moving toward the high-flux power beam, the object may be determined to be "near" the high-flux power beam when the object is within several feet of the high-flux power beam. When a medium-size, medium-mass object (e.g., a human being or a body part of a human being), is stationary or slowly moving toward a high-flux power beam, the medium-size, medium-mass object may be determined to be "near"

the high-flux power beam when the object is within one to 12 inches of the high-flux power beam. When the medium-size, medium-mass object is quickly moving toward the high-flux power beam (e.g., a human being walking, running, swinging an arm, or the like), the object may be determined to be "near" the high-flux power beam when the object is within several feet of the high-flux power beam. Along these lines, when a large-size, large-mass object (e.g., an automobile, an aircraft, a watercraft, a piece of construction equipment, or the like) is stationary or slowly moving toward a high-flux power beam, the large-size, large-mass object may be determined to be "near" the high-flux power beam when the object is within one or two feet of the high flux power beam. When the large-size, large-mass object is quickly moving toward the high-flux power beam, the object may be determined to be "near" the high-flux power beam when the object is within dozens or even several hundred feet of the high-flux power beam. Accordingly, the determination of whether or not an object is "near" a high flux power beam may be determined based on a predicted time of obstruction, size of an object, speed of an object, power intensity of the high flux power beam, or other such factors that contribute toward a determination of imminent obstruction by the object.

The present invention may be understood more readily by reference to the following detailed description of the preferred embodiments of the invention. It is to be understood that the terminology used herein is for the purpose of describing specific embodiments only and is not intended to be limiting. It is further to be understood that unless specifically defined herein, the terminology used herein is to be given its traditional meaning as known in the relevant art.

In many cases, the flux ($W/m^2$) in an optical high flux power beam is substantially above the safe limit for exposure to living tissue such as a human or animal eye. In some cases, the flux is high enough to cause eye damage and/or other non-eye damage such as burns or other changes to living tissue. It is thus important to detect when people, animals, or other objects are in or will imminently enter the high flux beam path during the time the beam is activated. In these and other cases, it may also be important to deter and/or prevent people, animals, and objects from entering the beam path while the beam is activated or will soon be activated.

In addition to direct exposure to a high flux power beam, hazardous amounts of light may be reflected specularly or diffusely by objects in, or passing through, the power beam. In some cases the high flux power beam may be intense enough to ignite flammable objects (e.g., paper, cardboard). Thus, unless the beam path is generally inaccessible to objects and living beings (e.g., in outer space), a laser power beaming system is improved by including a safety system arranged to detect hazards, including objects in or near the high flux beam path, and to shut off the high flux power beam or prevent the high flux power beam from being activated.

In general, embodiments of safety systems described herein may include multiple subsystems or mechanisms for detecting hazards, controlling the high flux power beam activation, and otherwise providing safety features. Some of the embodiments provide redundant or overlapping coverage.

In some safety system embodiments described herein, the high flux power beam is shut off at the source (e.g., by commanding a power supply to turn off). In some safety system embodiments described herein, the high flux power beam is blocked (e.g., with a mechanical or electronic shutter). In still other safety system embodiments described herein, the interaction between the high flux power beam and one or more objects is detected and/or prevented in other ways.

Some safety systems are employed in connection with other hazards that cannot easily be protected by physical barriers. Optical "fences" are used, for example, to detect when operators reach into hazardous areas around machinery. These other safety systems are very different from the safety systems described herein, however, because high flux power beams are very different from other types of dangerous machines. For example, laser power beaming systems are exceptional in the need for very rapid response to small objects due to the possibility of hazardous reflections over a long distance. Improved safety sensors are therefore of high value for power beaming, although they may be useful in other applications as well.

One problem with existing light curtains is that the emitters in the known systems are not individually distinguished by the detectors. It is therefore possible for a certain detector to receive (i.e., to "see") a light signal from more than its corresponding emitter. This reception of light from a non-corresponding emitter can lead to the light curtain failing to detect a small obstacle which partially or completely blocks one emitter if the certain detector continues to respond to other emitters. This problem can be resolved at least in part by using optics or baffles to limit the field of view of the emitters and/or the detectors such that each detector responds only to its single, corresponding emitter, but this solution is inadequate for longer-range or small-beam-spacing applications where spatially resolving individual emitters and/or detectors is difficult, and the solution is also undesirable because it requires precise positioning and maintenance of emitter and detector alignment.

In some embodiments described herein, a wireless power safety system includes a light curtain comprising a plurality of emitters that are distinguishably modulated, filtered, or otherwise differentiated such that each emitter, or each group out of two or more groups of emitters, has one or more uniquely identifiable characteristics (e.g., a unique signature). This particular wireless power safety system embodiment also includes one or more detectors arranged to selectively detect or otherwise identify a corresponding one or more emitters based on the one or more uniquely identifiable characteristics. The light curtain in this wireless power safety system embodiment further comprises a controller coupled to the one or more detectors, which can determine if any of a set of emitter-detector optical paths has been blocked or attenuated by an obstacle, and provide a corresponding output.

In some cases, the emitters of the embodiments described herein are distinguished at least in part by the one or more wavelengths of light they emit. The wavelengths may be inherent in the individual emitters (e.g., red, green, and blue LEDs or laser diodes operating at different wavelengths). Alternatively, or in addition, the wavelengths may be determined by filters of one type or another. The wavelength or wavelength combination of a particular emitter may be fixed or variable (e.g., by a tunable filter, by changing drive currents to the individual colors of a multicolor LED, or by other means). In these embodiments, the detectors may be inherently sensitive to selected wavelengths. Alternatively, or in addition, the light signals that reach the one or more detectors may be filtered and thereby responsive to selected wavelengths. In some embodiments, for example, one or more detectors are configured to detect some specific wavelength combinations and reject others. In these cases, a particular detector may comprise multiple photosensitive elements filtered to detect different wavelengths, and an associated electronic circuit may be configured to determine the ratio of the detected intensities at those wavelengths. In some embodiments, the detector may determine whether the intensities are consistent with a specific emitter. In some embodiments, the detector provides multiple outputs to a controller, which determines which emitter was the source of a particularly received light signal.

FIG. 1 is a power beaming system 100 having exemplary arrangements of guard beam emitters and guard beam detectors. In the power beaming system 100, a transmission unit 102 includes power-beaming transmitter 104. In some cases, the power-beaming transmitter 104 converts electric power into optical power (i.e., light). The power-beaming transmitter 104 may operate in the near-infrared (NIR) portion of the optical spectrum wavelength, such as between 0.7 and 2.0 μm, though wavelengths from a different part of the electromagnetic spectrum may also be used. The power-beaming transmitter 104 can be formed from a single laser or multiple lasers, which may be mutually coherent or incoherent. In some cases, the one or more lasers may be replaced by one or more light emitting diodes (LEDs), super-radiant diodes, or some other high-intensity light source. In addition to the high flux generation source, the power-beaming transmitter 104 includes particular optical structures such as optical fibers, lenses, mirrors, and various other beam shaping and focusing elements that create a high-flux power beam 106 of a desired size, shape, power distribution, and divergence. Various other elements of the power-beaming transmitter 104 aim the high-flux power beam 106 in a desired direction toward a reception unit 108. Certain electronic, mechanical, and/or electromechanical structures of the power-beaming transmitter 104 direct the operations of the transmission unit 102.

The high-flux power beam 106 produced by the power-beaming transmitter 104 is transmitted through free space from a first location, where the transmission unit 102 is positioned, toward a second location, where the reception unit 108 is positioned. At the reception unit 108, the high flux power beam 106 strikes power-beam receiver 110. The power-beam receiver 110 may include certain collecting optics such as lenses or mirrors, certain protective coverings, a power conversion means such as a photovoltaic array, and one or more safety mechanisms. The power conversion means (e.g., photovoltaic array, Stirling engine, or some other opto-electric or thermoelectric device) converts at least some portion of the received high-flux power beam 106 into electricity under the control and direction of the power beam receiver 110.

In FIG. 1, a first cross-section of the high-flux power beam 106 is shown as "A" and a second cross-section of the high-flux power beam 106 is shown as "B." The cross section at "A" shows a view looking toward the power beaming transmitter 104, and the cross section at "B" shows a view looking toward the power beam receiver 110.

Two different light curtain embodiments are also presented in FIG. 1. In a first embodiment, illustrated at the top of FIG. 1 above the high-flux power beam 106, a light curtain is formed having a plurality of guard beam emitters 112 patterned about the power-beaming receiver 110 and a plurality of corresponding guard beam detectors 114 patterned about the power beaming transmitter 104. In a second embodiment, illustrated at the bottom of FIG. 1 below the high-flux power beam 106, a light curtain is formed having a plurality of guard beam emitters 112 and a corresponding plurality of guard beam detectors 114 patterned about the power beaming transmitter 104. In this second light curtain embodiment, a plurality of retro-reflectors 116 are positioned about the power-beaming receiver 110.

In some embodiments, the light curtain includes emitters 112 having different colors of light emitting diodes (LEDs). For example, in the upper embodiment of FIG. 1, a light curtain consists of a repeating row of LEDs: red (R), green (G), blue (B), red, green, blue, and so on. Only some of the colored LEDs are illustrated in FIG. 1 for simplicity. The detectors 114 in the upper embodiment are correspondingly filtered based on the wavelength (i.e., color) of the expected emitter light signal. In the illustrated case, if each emitter 112 is spaced 3.3 centimeters (cm) apart, then each detector 114 can distinguish between same-colored emitters 112 that are spaced 10 cm apart. That is, each detector 114 will respond to a directly opposite emitter 112 emitting a same color, but the detector 114 will not respond to an adjacent emitter 112 of a different color, and the detector 114 will not receive a signal from a same color emitter 112 that is 10 cm away from directly opposite due to the ease of directionally aiming the emitters 112 toward corresponding detectors 114. More or fewer colors could certainly be implemented, however, in the present example, by selecting three colors, the emitters 112 and detectors 114 can be spaced about 3.3 cm apart (10 cm/3 colors=3.3 cm/color), and therefore, the guard beam will reliably detect obstacles as small as about 4 cm.

In other embodiments, the light curtain includes emitters 112 that are different based on some other characteristic such as synchronized timing, modulation, encoded patterns, and the like. For example, in the lower embodiment of FIG. 1, a light curtain consists of a repeating row of LEDs: "a", "b", "c", a, b, c, and so on. Here, the emitters 112 of the light curtain may sequentially emit signals "a", then "b", then "c", and the pattern is repeated. Alternatively, the emitters 112 of the light curtain may emit signal "a" with a first pulsed, modulated, or otherwise encoded pattern while concurrently or otherwise emitting signals "b" and "c" with different pulsed, modulated, or otherwise encoded patterns. In these cases, corresponding detectors 114 are arranged to detect a pattern of their line-of-sight emitter 112. In the exemplary embodiments, three wavelengths (e.g., three colors) have been described, and emitters having other distinguishing characteristics have also been discussed. It is recognized that the embodiment discussed in the present disclosure may include more or fewer wavelengths, more or fewer patterns, and more or fewer other distinguishing characteristics. Several other non-limiting embodiments of emitter and detector encodings are later described in the present disclosure.

Turning to another feature in the lower embodiment of FIG. 1, emitters 112 and detectors 114 are co-located in proximity to each other in a particular pattern around the power-beaming transmitter 104. The co-located set of emitters 112 and detectors 114 may otherwise be referred to in the present disclosure as a single-end system or a single-ended system, which is different from conventional systems that locate light sources and light detectors at opposite ends of a power beam path (i.e., emitters at either a power beam transmitter or a power beam receiver, and detectors at either a power beam receiver or a power beam transmitter, respectively).

Although some types of retro-reflectors are used in conjunction with some types of known beam-break sensors such as garage door openers, these systems generally employ "bicycle reflector" type retro-reflectors, molded corner cube reflectors, or reflective tape, with each emitter-detector pair providing a single sensing beam path. These rudimentary systems are different from the embodiments discussed herein for several reasons including that the embodiments described herein encode emitted light signals, operate light curtains with signals of different wavelengths, employ retro-reflectors 116 having particular optical properties (discussed herein), and for other reasons.

In one aspect of the invention, retro-reflectors 116 are used so that both the emitters 112 and detectors 114 for any kind of guard beam system can be co-located at the same end of the beam path. One embodiment, for example, locates retro-reflectors 116 in proximity to the power-beam receiver 110 and locates the emitters 112 and detectors 114 in proximity to the power-beam transmitter. This type of single-ended arrangement allows the reception unit 108 to be passive, and all sensing related to safety is located at the transmission unit, where control of the high-flux power beam is preferably performed.

The retro-reflectors 116 in FIG. 1 may be discrete retro-reflectors such as corner cubes or cat's eye reflectors, which have a lens with a reflector in its focal plane. Alternatively, or in addition, the retro-reflectors 116 in FIG. 1 may be areas of retroreflective tape, such as that manufactured by 3M CORPORATION. In some embodiments, such tape generally consists either of sheets of small corner cubes or sheets of glass spheres that act as cat's eye reflectors. In some embodiments the retro-reflectors 116 may be continuous strips of retro-reflective RR material. In other embodiments, the retro-reflectors 116 are separate, non-contiguous "dots" of retro-reflective material.

As illustrated in the lower embodiment of FIG. 1, a first retro-reflective surface 116 is positioned remote to a first emitter 112a and first detector 114a, wherein the first emitter 112a is positioned in proximity to the first detector 114a, and wherein a first optical path includes two first sub-paths: one first sub-path between the first emitter 112a and the first reflective surface 116, and another first sub-path between the first reflective surface 116 and the first-detector 114a. A second reflective surface 116 is positioned remote to a second emitter 112b and a second detector 114b, wherein the second emitter 112b is positioned in proximity to the second detector 114b, and wherein the second optical path also includes two second sub-paths: one second sub-path between the second emitter 112b and the second reflective surface 116, and another second sub-path between the second reflective surface 116 and the second-detector 114b.

In the single-ended embodiments discussed with respect to FIG. 1, emitters 112 and detectors 114 are co-located at one end of the high-flux power beam 106 or other region to be protected. One or more retro-reflectors 116 are discussed, however other embodiments are also contemplated. For example, the retro-reflectors 116 of FIG. 1, in some embodiments, are implemented as a continuous retro-reflective surface such as retro-reflective tape. In other embodiments, for example when the power-beaming transmitter 104 and a power-beam receiver 110 can be appropriately aligned, the retro-reflectors 116 of FIG. 1 may be implemented by a suitable flat or curved specular reflector (e.g., a mirror), a diffusely reflective or scattering surface (e.g. a white-painted surface), or some other means to literally reflect or virtually (i.e., mimic) reflect the emitted guard beam signals.

In both the upper embodiment of FIG. 1 and the lower embodiment of FIG. 1, there is a one-to-one correspondence between emitters 112 and detectors 114. That is, for each emitter 112, there is a corresponding detector 114. In other embodiments, one-to-one correspondence is not necessary or present. For example, in some embodiments, a detector 114 may employ selectable or tunable filters or other characteristics such that a single detector 114 can respond to different wavelengths or wavelength combinations at different times. In addition, or in the alternative, an emitter 112 may be controllable to emit signals having different wavelengths, different light patterns, different encoding, or some other different characteristics such that a single emitter 112 can emit a plurality of signals, each of the plurality of signals directed to a different corresponding detector 114.

Figure 2:
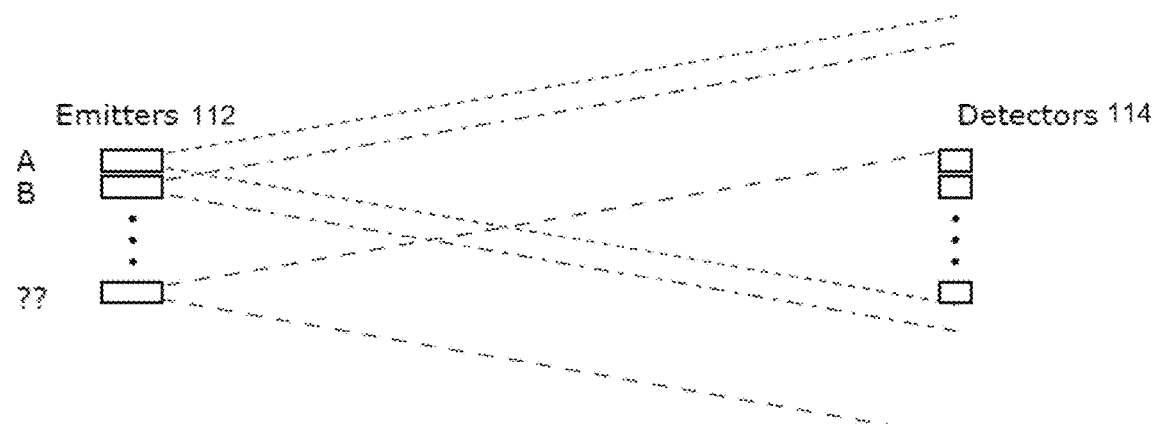
FIG. 2 is a plurality of emitters and detectors, the emitters having overlapping guard beam light fields.

FIG. 2 is a plurality of emitters 112 and detectors 114, the emitters 112 having overlapping guard beam light fields. In some cases, the emitters 112 have a one-to-one correspondence with the detectors 114. In other cases, an emitter 112 is arranged to generate two or more guard beam signals wherein each of the two or more guard beam signals has at least one distinguishable characteristic from the other guard beam signals. In these or in still other cases, a detector 114 is arranged to detect a plurality of guard beam signals having different characteristics. The overlapping guard beam signals produced by emitters 112 and detected by detectors 114 of FIG. 2 illustrate the flexibility of the embodiments described herein. Furthermore, as evident in FIG. 2, a nearly impenetrable light curtain can be formed around a high-flux power beam 106 such that whenever a foreign object of nearly any size, shape, and speed approaches the high-flux power beam 106, the foreign object can be detected and the high-flux power beam can be safely interrupted.

Figure 3A:
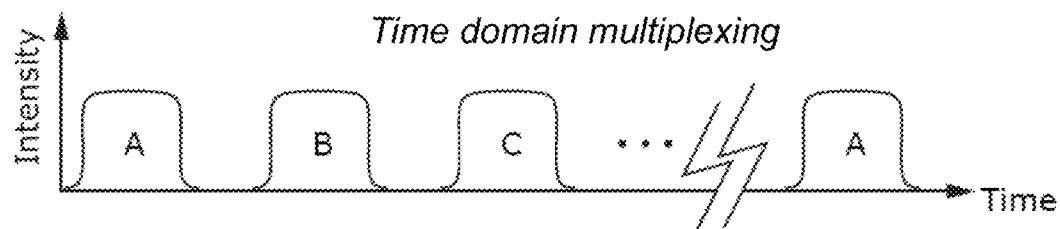
FIGS. 3A-3C are guard beam signal intensity plots distinguishing multiple guard beam emitter light signals from each other.
Figure 3B:
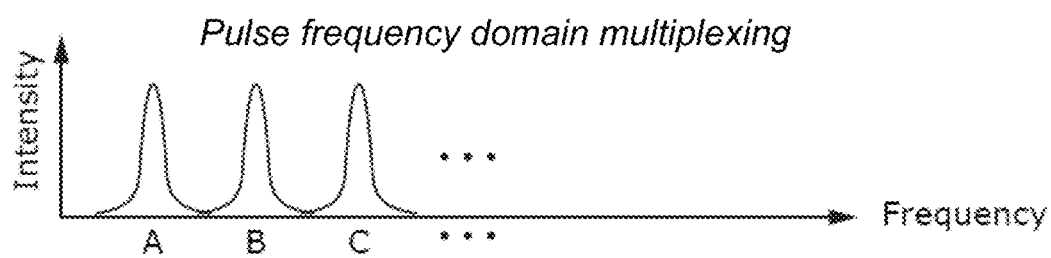
Figure 3C:
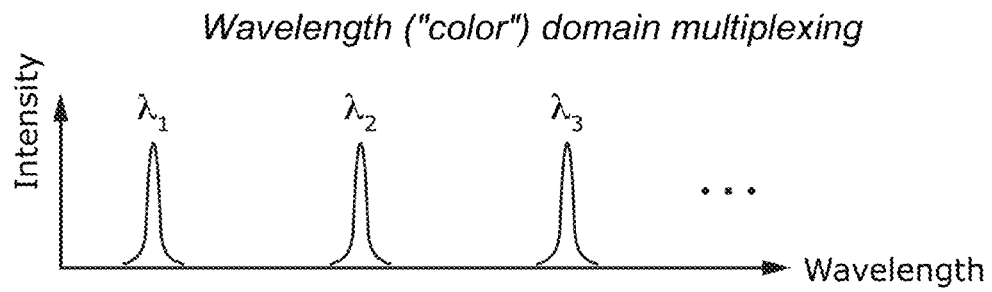

FIGS. 3A-3C are guard beam signal intensity plots distinguishing multiple guard beam emitter light signals from each other. In FIG. 3A, a signal intensity plot illustrates time domain multiplexing of a plurality of emitter signals; in FIG. 3B, a signal intensity plot illustrates pulse frequency domain multiplexing of a plurality of emitter signals; and in FIG. 3C, a signal intensity plot illustrates wavelength (e.g., "color") domain multiplexing.

In some embodiments, emitters such as emitters 112 of FIG. 1 are distinguished at least in part by time of illumination. For example, an emitter 112, or a group of emitters 112, may be assigned one or more time slots from a plurality of time slots. During a respective time slot, each emitter 112 or group of emitters 112 that is assigned to the time slot is turned on by an emitter driver. Outside of an assigned time slot, the particular emitter 112 or group of emitters 112 is attenuated, turned off, shielded, or otherwise prevented from emitting its guard beam signal. In these embodiments, any particular detector 114, or a plurality of detectors 114, may be activated or otherwise enabled to detect card beam light signals during any time slot, during any set of time slots, or during all time slots. A controller coupled to the one or more detectors 114 may be configured to act on the absence of a response from one or more detectors 114 during a time slot when each of the particular detectors 114 is expected to receive a guard beam signal from at least one emitter 112. The controller may, for example, determine that the absence of a signal is indicative of a foreign object impinging on the power beam 106 (e.g., near or impeding a high-flux power beam 106), and the controller may further generate a responsive signal or otherwise cause or direct an interruption of the high-flux power beam 106.

FIG. 3A illustrates one embodiment of time domain multiplexing wherein a first emitter 112 or first set of emitters 112 is assigned time slot "A" and second and third emitters 112 or second and third sets of emitters 112 are respectively assigned time slots "B" and "C." In the embodiment of FIG. 2, emitters 112 generate and emit guard beam signals during their assigned time slots, and a controller (not shown in FIG. 2) is arranged to detect the emitted guard beam signals.

In some embodiments, including the embodiments represented in the signal intensity plots of FIGS. 3A-3C, a controller that directs operations of one or more detectors may be synchronized in time with one or more emitter drivers. In these embodiments, the controller may be synchronized in time with the emitter drivers via a system-wide unique spatial and/or temporal pattern of emitted guard beam signals that are recognizable by the controller. For example, all emitters may be turned off for one time slot, or all emitters may be turned on for one time slot, or some set of emitters may be turned on for a determined number (e.g., two) of successive time slots as a synchronization signal. After the synchronization signal is emitted, subsequent emitter activations may be emitted lasting for only one time slot. Alternatively, in some embodiments, a separate synchronization signal, such as a light pulse from an emitter to a detector separate from the light curtain, may be used. In still other embodiments, synchronization between emitters and detectors may be accomplished by reference to a common signal, such as a GPS signal, a cellular radio signal, or some other distinguishable signal.

The signal intensity plot of FIG. 3B illustrating pulse or modulation frequency domain multiplexing may be implemented in some embodiments by an arrangement of emitters 112 pulsed in some cases in a repeating sequence (e.g., 1, 2, 3, 4, . . . N, 1, 2, . . . ). In other cases, the pulsing or modulation can occur concurrently amongst two or more emitters 112 or in some other pattern or arrangement. In these embodiments, a controller may look for an output from the corresponding detectors 114 according to the expected repeating sequence (e.g., 1, 2, 3, 4, . . . N, 1, 2, . . . ). In these embodiments, the controller will generate an alarm signal if any detector 114 does not detect an emitted pulse at the correct time (e.g., with the in a determined time window). In a related and alternative embodiment, the emitters 112 and detectors 114 may have wide fields of view (e.g., FIG. 2), such that each detector 114 responds to all emitters 112. In these embodiments, the controller may be arranged to generate an alarm signal if any detector 114 fails to detect a pulse in any time slot. Due to the wide fields of view, the plurality of emitters 112 and detectors 114 creates a light curtain having a dense "weave" of paths, and when any of the paths in the dense weave is blocked, the object, which may be very small, will be detected.

In some embodiments, emitters 112 are distinguished at least in part by a modulation frequency. An emitter 112, or a group of emitters 112, may be modulated by varying a drive current of an LED, for example in a sinusoidal or square-wave fashion. In these cases, the drive current will have a frequency substantially higher than the inverse of the desired response time of the light curtain so as to permit fast detection of an object impinging on a high-flux power beam 106 (e.g., approaching or impeding a high-flux power beam 106). The modulation of any emitter 112 may be 100% (i.e., turning the LED fully on and turning the LED fully off), or the modulation may be at a lower percentage. Modulating an emitter 112 at less than 100% may improve response time. Alternatively, or in addition, modulating different emitters 112 at different frequencies or amplitudes may permit detection and distinguishing of different emitters 112 byte particular ones of the detectors 114.

In some cases, different emitters 112 are modulated at different frequencies. In these cases, some or all of the detectors 114 may be coupled to one or more filter elements, each of which responds to the detection of light modulated at a particular frequency. For example, a row of 10 LED or laser diode emitters 112 may be modulated at, respectively, 1.0 MHz, 1.05 MHz, 1.1 MHz, and so on up to 1.45 MHz. In this way, individual detectors 114 may be arranged to identify the particular emitted guard beam signal from its assigned, corresponding emitter 112. Alternatively, or in addition, one or more detectors 114 may be arranged to identify guard beam signals emitted by a plurality of emitters 112, each having a different modulation rate. Accordingly, in some embodiments each detector 114 and its associated filter may respond to a single emitter 112. In other embodiments, emitters 112 and detectors 114 may have wide fields of view, and each detector 114 may be coupled to several filters, again creating a "weave" of paths from each emitter 112 to multiple detectors 114 and vice versa. In these cases, blocking any one line-of-sight path between an emitter 112 and a detector 114 is detected and determined to be a foreign object impinging on a high-flux power beam 106 (e.g., near or impeding a high-flux power beam 106).

In some embodiments, a more complex coded modulation may be used in place of a simple single-frequency modulation. Such modulations may include multi-frequency modulations, orthogonal pseudo-random binary coded modulations, and the like. In these cases, the controller associated with one or more detectors 114 is arranged to capture signal data from one or more detectors 114, transformationally analyze the captured signal data (e.g., using a fast Fourier Transform (FFT)), and detect dominant modulated signals within a large volume of signal detection data caused by a plurality of different emitters 112, sunlight, other ambient light, other man-made light, and the like. Use of such complex modulations reduces the chance that any undesired or unexpected light source mimics a modulated emitter 112.

In FIG. 3C, a plurality of emitters 112 are arranged to emit guard beam light signals, each having a different wavelength. In the signal intensity plot of FIG. 3C, three emitters 112, or three sets each having a plurality of emitters 112, are arranged such that each emitter 112 or set of emitters 112 generates and emits a guard beam light signal of a different wavelength (e.g., color). One or more detectors 114 may be arranged with one or more filters particular to one or more of the colors associated with the emitters 112. A controller is arranged to direct the operations of the detectors 114, and when an expected signal of a particular wavelength or color is not received, the controller determines that a foreign object is impinging on a high-flux power beam 106 (e.g., near or impeding the high-flux power beam 106). In these cases, the controller is arranged to generate a signal that causes or otherwise directs an interruption of the high-flux power beam 106.

In some embodiments, emitters 112 surround a power-beam receiver 110, while detectors 114 are located about a power-beaming transmitter 104. In these embodiments, the active line-of-sight paths (i.e., paths responsive to obstacles) between the emitters 112 and receivers 114 form a protective light curtain around a high-flux power beam 106. In other embodiments, the emitters 112 may be located about the power-beaming transmitter 104, and the detectors 114 located about the power-beam receiver 110. In these embodiments, a separate signaling pathway may be arranged to either transmit an alarm signal from the reception unit 108 toward the transmission unit 102 directing an interruption of the high-flux power beam 106 or a "safe" signal directing transmission of the high-flux power beam 106; the absence of such safe signal being interpreted by the reception unit as an alarm signal directing an interruption of the high-flux power beam 106.

The embodiments described herein using distinguishable emitters 112 provide benefits that may not be realized with conventional beam-break systems. For example, the safety curtain technology described in the present disclosure can be used effectively at distances greater than would be feasible with a conventional beam-break system, because the detectors 114 do not need to optically resolve each individual emitter 112 or vice versa to detect the blocking of a single emitter 112 or detector 114 by an obstacle. In addition because individual emitters can be distinguished, a light curtain may be formed around a high-flux power beam 106 in a very tight weave, which is not possible in conventional beam-break systems.

Figure 4A:
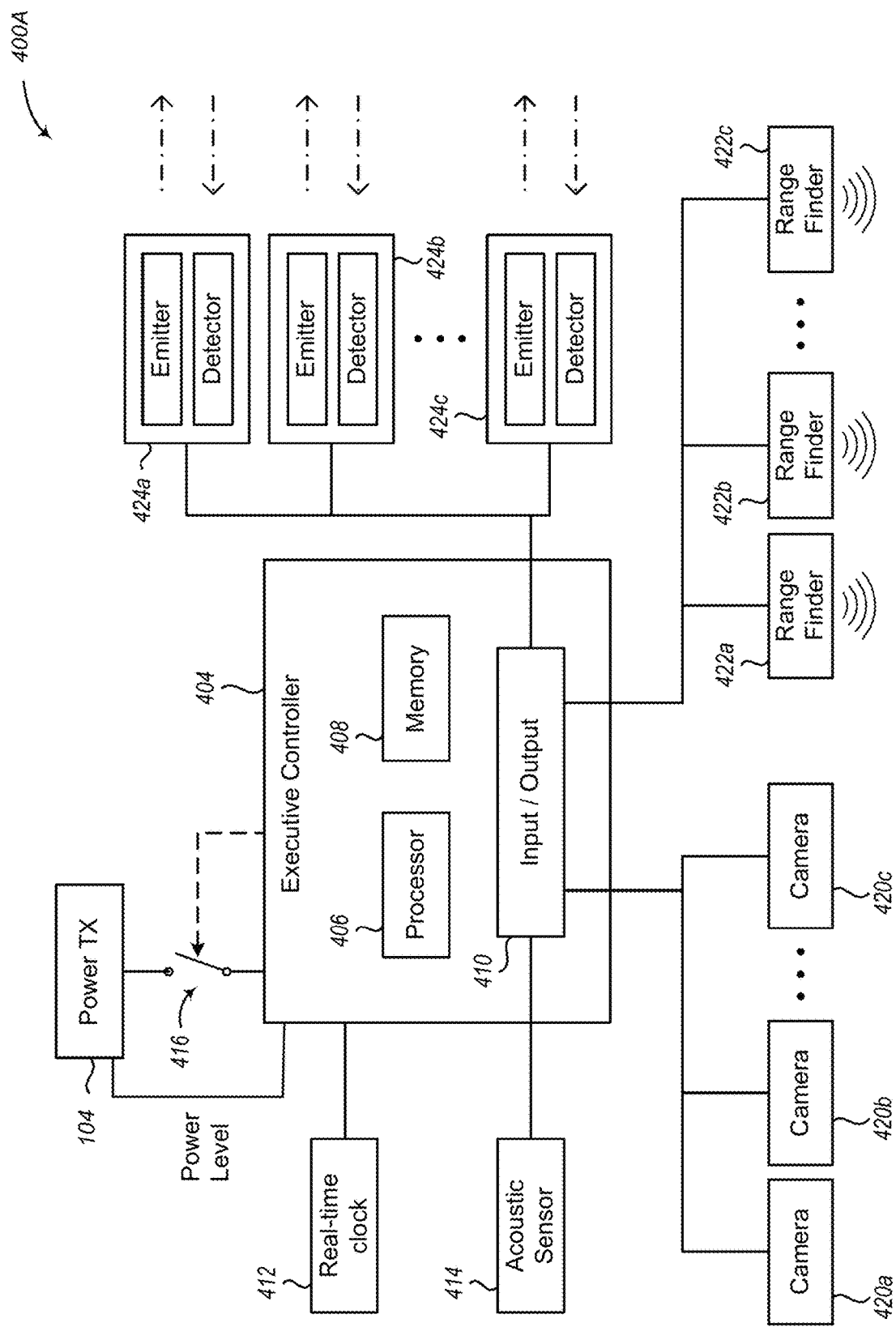
FIG. 4A is a system diagram of a first power beam safety system embodiment.

FIG. 4A is a system diagram of a first power beam safety system embodiment 400A. The power beam safety system embodiment 400A can be cooperatively implemented by the transmission unit 102 and reception unit 108 of FIG. 1.

The first power beam safety system embodiment 400A includes a power-beaming transmitter 104 for generating and transmitting a high-flux power beam 106. The power beam safety system embodiment 400A also includes an executive controller 404.

The executive controller 404 includes a processor 406, a memory 408, and an input/output interface 410. The processor 406 includes one or more processing units (e.g., central processing units) that execute instructions to perform actions, including actions to perform embodiments described herein to utilize sensor data to interrupt (e.g., shut down, block, power down, or the like) the high-flux power beam 106. The executive controller 404, the processor 406, or the executive controller 404 and the processor 406 together, may be interchangeably referred to in the present disclosure as a controller.

The memory 408 may be utilized to store information, such as the computer-readable instructions that are utilized by the processor 406, and other information, such as, for example, thresholds to compare against sensor data to determine if an object is impinging on a high-flux power beam 106 (e.g., near, impeding, or about to impede the high-flux power beam 106).

The input/output interface 410 provides a communication interface between the executive controller 404 and a plurality of sensors. The executive controller 404 receives information from the sensors and, in some embodiments, provides commands to the sensors via the input/output interface 410.

The sensors in the power beam safety system embodiment 400A may include one or more cameras 420, one or more rangefinders 422, one or more single-ended sensing systems 424 (e.g., emitters 112 and detectors 114), one or more acoustic sensors 414, and in addition or in the alternative, other sensors. The sensors may be configured to have different or overlapping (fully or partially) effective areas to detect the one or more same or different objects.

The acoustic sensor 414 may utilize directional listening technology to detect an object. The cameras 420a-420c may capture images from various directions. The rangefinders 422a-422c may be configured to detect an object impinging on the power beam (e.g., near, impeding, or about to impede the power beam) at some distance between the power-beaming transmitter 104 and the power-beam receiver 110.

The single-ended sensing systems 424a-424c of the power beam safety system embodiment 400A may include one or more pairs or other pluralities of emitters 112 and detectors 114, which are illustrated in FIG. 1 and described with respect to FIG. 1 and elsewhere. For example, the single-ended sensing systems 424a-424c each include one or more emitters 112 that emit time-varying optical signals that are reflected back to one or more corresponding detectors 114. The signals received at the one or more detectors 114 are used to determine if an object is impinging on the high-flux power beam 106 (e.g., near, impeding, or about to impede the high-flux power beam 106). In various embodiments, the single-ended sensing systems 424a-424c may utilize a real-time clock 412 to generate and emit time-varying optical signals.

The executive controller 404 monitors the sensors via the input/output interface 410 for sensor output information regarding detected objects. The executive controller 404 also monitors and controls the power level of the power-beaming transmitter 104. In some embodiments, some sensors may provide an object-intrusion indication that is a "binary" signal (e.g., yes/no) that is activated when the sensor detects an object. For example, a single-ended sensing system 424 may determine that a line-of-sight between a first emitter 112 and a first detector 114 has been blocked by a foreign object. In these or other embodiments, different sensors may provide object-detection information associated with the detection of an object (e.g., images from a camera 420, distance reading from a rangefinder 422, and the like). The executive controller 404 is arranged to utilize the object-detection information and one or more thresholds to determine if an object is impinging on the high-flux power beam 106 (e.g., near, impeding, or about to impede the high-flux power beam 106). In addition, the executive controller 404 is also arranged to monitor and control the power level of the power-beaming transmitter 104.

In at least one embodiment, the executive controller 404 interrupts the transmission of the high-flux power beam 106 by the power-beaming transmitter 104 via switch 416 when a single sensor detects an object impinging on the high-flux power beam 106 (e.g., near, impeding, or about to impede the high-flux power beam 106). In other embodiments, information from a plurality of sensors may be utilized to determine if an object is impinging on the high-flux power beam 106 (e.g., near, impeding, or about to impede the high-flux power beam 106). In this embodiment along with others, the executive controller 404 may also, for example, direct the power-beaming transmitter 104 into a lower intensity mode as objects change position in proximity to the high-flux power beam 106. The executive controller 404 may, for example, direct the power-beaming transmitter 104 to remain in a low-flux mode, a power-off state, or some other condition based on one or more conditions detected or otherwise determined using the various sensors described herein.

In various embodiments, information from some sensors is weighted higher (e.g., if a sensor is more accurate) than information from other sensors (e.g., if a sensor is less accurate), such that a combination of the sensor information is compared against one or more thresholds to determine if an object is impinging on the high-flux power beam 106 (e.g., near, impeding, or about to impede the high-flux power beam 106).

Along these lines, a wide variety of sensors may be employed in the embodiments discussed herein. In some cases, the sensors provide raw data output signals that need to be processed in order to provide useful data for safety sensing. In other cases, individual sensors have circuitry that pre-process raw signal data before sending processed information to an attached processor or controller such as executive controller 404. In cases where the sensors send raw data, a higher level processor such as processor 406 analyzes raw data and determines when the high-flux power beam 106 should be interrupted. In other cases, where a sensor pre-processes data, a higher level processor such as processor 406 may simply receive an indication of object detection or other such high-level information. In these cases, the safety system may process the high-level indication in real time to interrupt the high-flux power beam 106. In still other cases, the executive controller (e.g., processor 406) may have access to both high-level object intrusion information and the raw data from the sensor. In this case, the executive controller can perform more elaborate processing such as combining information from several sensors to determine whether or not the high-flux power beam 106 should be interrupted.

Figure 4B:
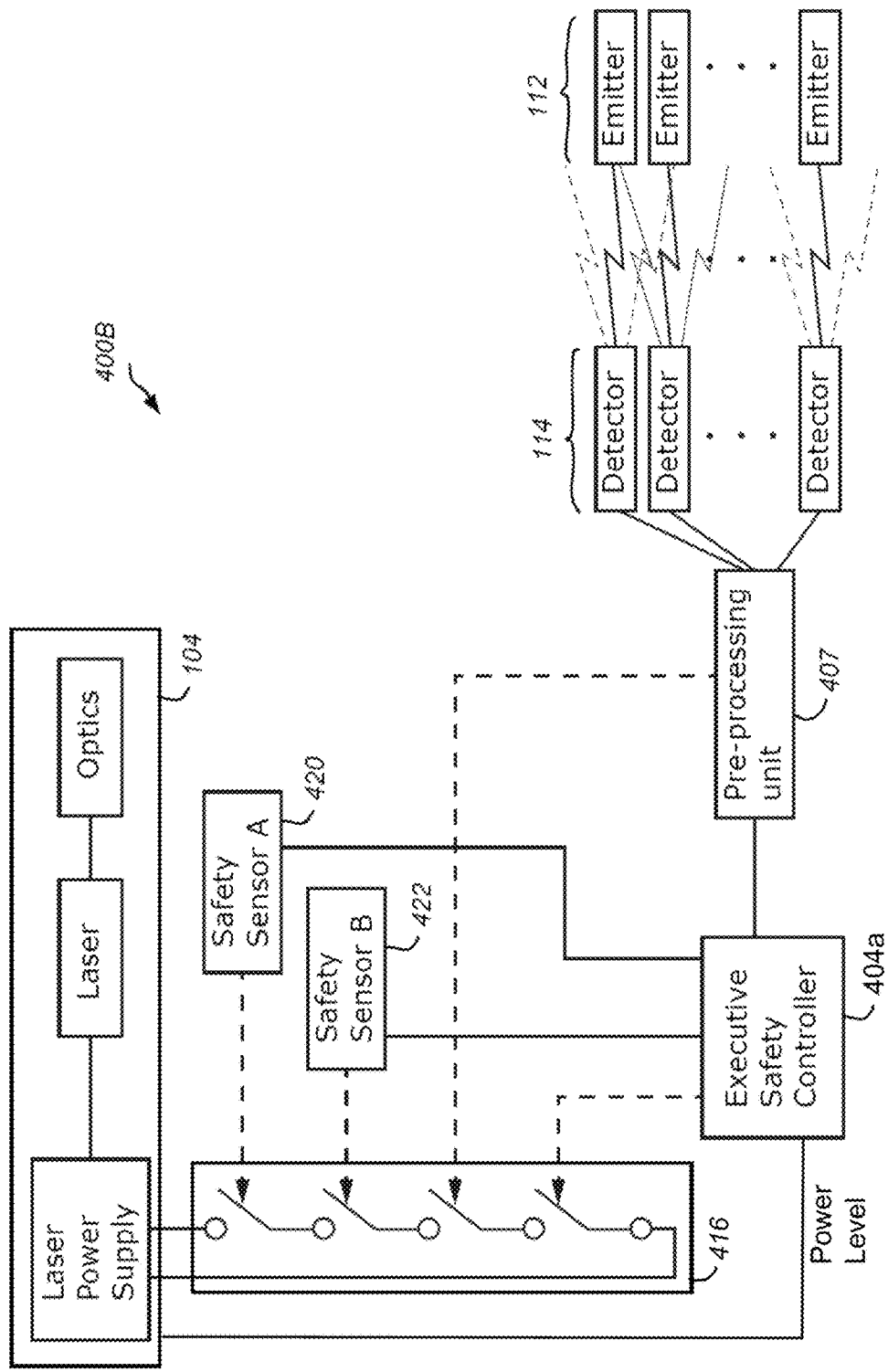
FIG. 4B is a system diagram of a second power beam safety system embodiment.

FIG. 4B is a system diagram of a second power beam safety system embodiment 400B. In the second power beam safety system embodiment 400B, a power-beaming transmitter 104 includes a laser power supply, a laser, and particular optics that cooperate to generate and transmit a high-flux power beam 106. When a particular foreign object is impinging on the high-flux power beam 106 (e.g., detected near or impeding the high-flux power beam 106), a switch 416 is used to stop or otherwise interrupt transmission of the high-flux power beam 106.

In FIG. 4B, the switch 416 is configured as an interlock circuit. The switch 416 may include a plurality of electronic, mechanical, or electromechanical switches, shades, shutters, circuit breakers, or other means to interrupt the transmission of the high-flux power beam 106. Operations of the switch 416 may be directed by an executive safety controller 406.

The executive safety controller 406 may direct operations of a plurality of safety systems, or otherwise receive input and take action based on the operations of one or more safety systems. For example, the executive safety controller 406 is communicatively coupled to a first safety system (i.e., safety sensor A), which may include one or more cameras 420, and the executive safety controller 406 is communicatively coupled to a second safety system (i.e., safety sensor B), which may include one or more rangefinders 422. The executive safety controller 406 may be coupled to any number of additional safety sensors including one or more single-ended guard beams that form a light curtain.

In the second power beam safety system embodiment 400B of FIG. 4B, a plurality of emitters 112 and a plurality of detectors 114 are arranged as described in the present disclosure. In some cases, the plurality of emitters 112 and the plurality of detectors 114 are configured as one or more single-ended sensor systems cooperatively positioned or otherwise arranged with reflecting means such as retro-reflectors 116. In other cases, the plurality of emitters 112 and the plurality of detectors 114 of FIG. 4B are arranged about a power-beaming receiver 110 (FIG. 1) and a power-beam transmitter 104 (FIG. 1), respectively.

In FIG. 4B, a pre-processing unit 407 receives raw or processed data from the one or more detectors 114. The pre-processing unit 407 is optionally coupled to switch 416. In these cases, detection data from one or more detectors 114 is very quickly analyzed and, when an object is impinging on the high-flux power beam 106 (e.g., determined to be near or impeding the high-flux power beam 106), the transmission of the high-flux power beam 106 is very quickly interrupted. Alternatively, or in addition, data from the pre-processing unit 407 is passed to the executive safety controller 404a for additional analysis, consolidation, processing, or the like.

The executive safety controller 404a of FIG. 4B performs along the same lines as the executive controller 404 of FIG. 4A. The executive safety controller 404a may be arranged to monitor and control a power level of the power-beaming transmitter 104, monitor and control an interlock 416, monitor and control a plurality of emitters 112 and detectors 114, and perform other functions. For example, in some embodiments, the executive safety controller 404a may reduce power, power down, or direct another power level in the power-beaming transmitter based on singular, aggregated, or any other combination of raw data from any number of emitters 112 and detectors 114. In other cases, the executive safety controller 404a may enable or disable operations of the power-beaming transmitter 104 based on a history of sensor data, a prediction of future interruptions, a schedule, or any other characteristics.

Non-limiting and exemplary operation of certain aspects of the disclosure will now be described with respect to FIGS. 5A-5C. In at least one of various embodiments, processes 500A-500C described in conjunction with FIGS. 5A-5C, respectively, may be implemented by or executed on one or more computing devices, such as an executive controller 404, single-ended sensing system 424, or other object detection systems for power beams.

Figure 5A:
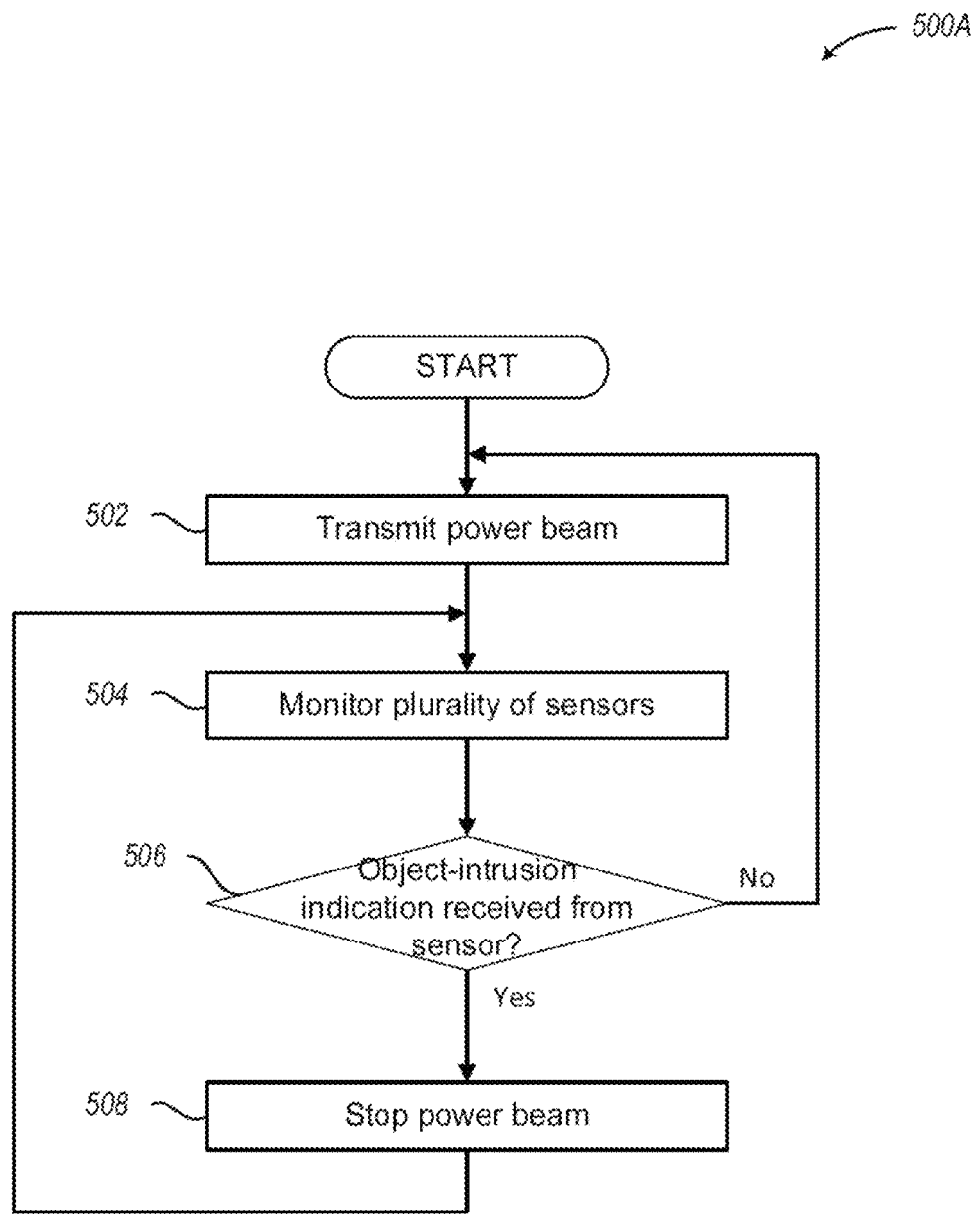
FIG. 5A is a logical flow diagram generally showing one embodiment of a process for utilizing a plurality of safety sensors with a power beam to turn off the power beam.

FIG. 5A is a logical flow diagram generally showing one embodiment of a process 500A for utilizing a plurality of safety sensors with a power beam 106 to interrupt the power beam 106.

Process 500A begins after a start block. At block 502 a high-flux power beam 106 is generated and transmitted from a transmission unit 102. In various embodiments, the high-flux power beam 106 is transmitted to a reception unit 108, which is coupled with other circuitry to convert power from the high-flux power beam 106 into electricity. As a result, electronics coupled to the reception unit 108 can be wirelessly charged or otherwise receive power derived from the power source of the transmission unit 102 and the high-flux power beam 106.

Process 500A proceeds to block 504, where a plurality of sensors such as one or more cameras 420, one or more range finders 422, and one or more single-ended sensing systems 424, which may include detectors 114, are monitored for information indicating that an object is impinging on the high-flux power beam 106 (e.g., impeding, near, or about to impede the high-flux power beam 106). As described elsewhere herein, these sensors utilize a variety of different technologies to detect the presence of an object, and are positioned and configured to detect objects that are impinging on the high-flux power beam 106 (e.g., impeding, near, or about to impede the high-flux power beam 106). Similarly, sensors can be configured to detect objects that have different characteristics (e.g., size, shape, reflective properties, direction and rate of movement, location, distance from transmitter or sensor, etc.).

When a sensor detects an object or otherwise generates data associated with a detected object, the sensor outputs information regarding the detected object. In some embodiments, the output is an object-intrusion indication, which is a "binary" signal that indicates that the sensor has detected an object. In other embodiments, the output is object-detection information, which includes additional information about the detected object. This additional information may include, but is not limited to, size of the object, location of the object relative to the high-flux power beam 106, distance from the transmission unit 102, or sensor, speed and direction the object is moving, or other information that is used to determine if the object is in fact impinging on the high-flux power beam 106 (e.g., impeding, near, or about to impede the high-flux power beam 106).

Process 500A continues at block 506, where a determination is made whether an object-intrusion indication is received from one or more of the plurality of sensors. As mentioned herein, the object-intrusion indication may be a "binary" signal that indicates that an object was detected by the sensor. If an object-intrusion indication is recited from any one of the plurality of sensors, process 500A flows to block 508; otherwise, process 500A loops to block 502 to continue to transmit the high-flux power beam 106 and monitor the sensors for object intrusions.

At block 508, the high-flux power beam 106 is stopped in response to receipt of the object-intrusion indication. Stopping the high-flux power beam 106 may include powering down or halting the high-flux power beam 106, closing a shutter or cap on the transmitter to prohibit the high-flux power beam 106 from being projected towards the receiver, putting the high-flux power beam 106 into a safe mode of operation, or otherwise interrupting or terminating the transmission of the high-flux power beam 106 from the transmission unit 102.

In various embodiments, a positive indication of a detected object for just one of a plurality of sensors results in the high-flux power beam 106 being immediately stopped. In this way, even a false positive detection will result in the high-flux power beam 106 being stopped. And since, in some embodiments, the sensor coverage overlaps, there is a higher likelihood that if one sensor misses an object, another sensor will detect it.

In other embodiments, a combination of object-intrusion indications from multiple sensors is used to determine whether the high-flux power beam 106 is stopped or not. For example, in at least one embodiment, the high-flux power beam 106 will not be stopped unless two or more sensors provide an object-intrusion indication. In this way, a malfunctioning sensor may not unnecessarily keep stopping the high-flux power beam 106. A malfunctioning sensor may be identified when it routinely detects an object in an overlapped sensor area, but the other overlapping sensors do not detect the object. This lack of consistency between sensors indicates that one of the sensors is less reliable than the others, and may also indicate that one sensor is malfunctioning. In some embodiments, the system may be calibrated or re-calibrated to account for a sensor that is malfunctioning or is consistently providing object-intrusion indications when other sensors are not.

After block 508, process 500A loops to block 504 to continue to monitor the plurality of sensors to determine whether the object is still impinging on the high-flux power beam 106 (e.g., near or impeding the high-flux power beam 106) at decision block 506. If the object is no longer impinging on the high-flux power beam 106 (e.g., near or impeding the high-flux power beam 106) the transmission unit 102 may begin retransmitting the high-flux power beam 106 (at block 502). In this way, process 500A is perpetual.

Figure 5B:
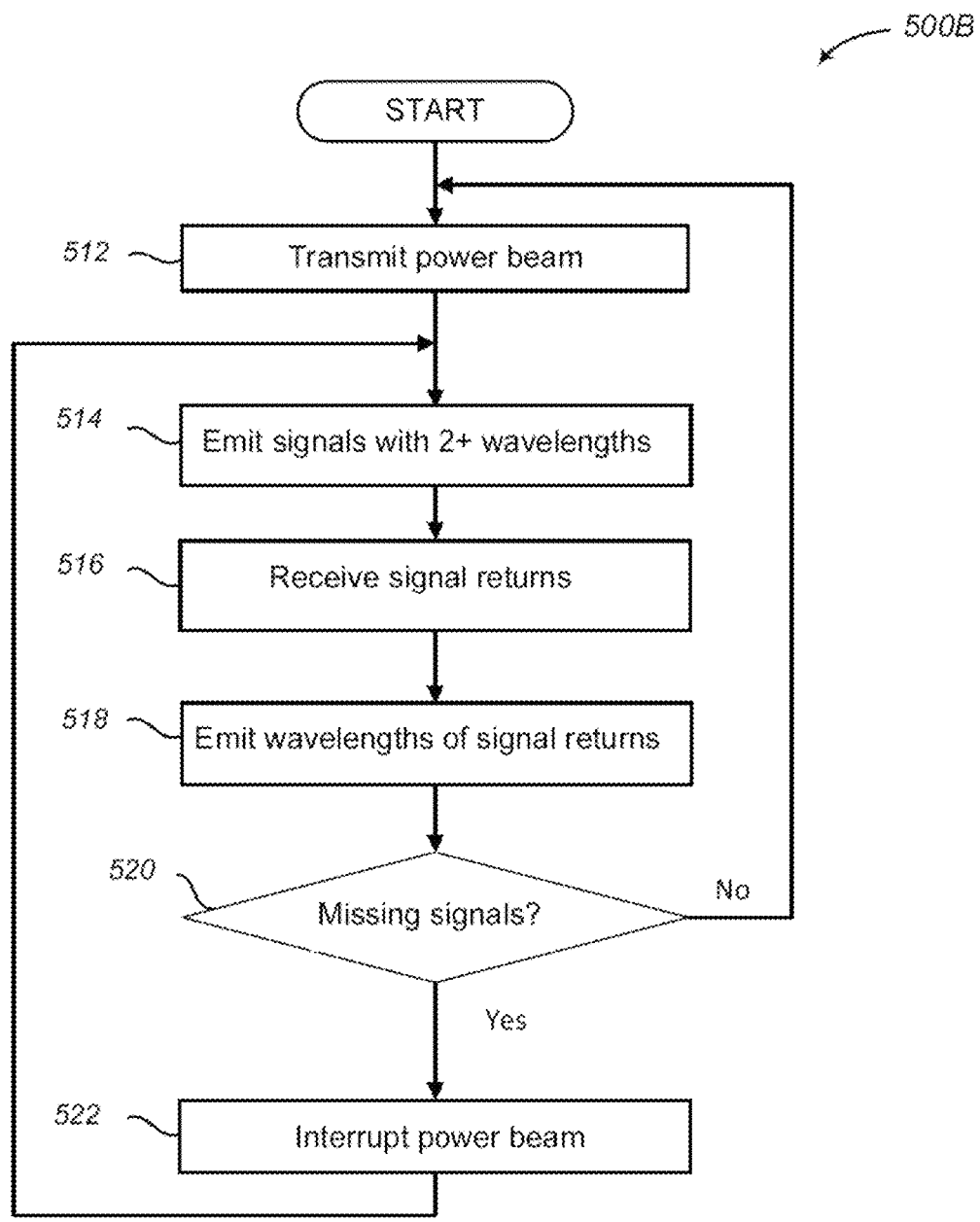
FIG. 5B is a logical flow diagram generally showing one embodiment of a process for utilizing a plurality of safety sensors that detect signals of multiple wavelengths to interrupt a power beam based on an intrusion by one or more detected objects.

FIG. 5B is a logical flow diagram generally showing one embodiment of a process 500B for utilizing a plurality of safety sensors that detect signals of multiple wavelengths to interrupt a high-flux power beam 106 based on an intrusion by one or more detected objects.

Process 500B begins after a start block. At block 512 a high-flux power beam 106 is generated and transmitted from a transmission unit 102 toward a reception unit 108, which is coupled with other circuitry to convert power from the high-flux power beam 106 into electricity.

At block 514, a light curtain is formed using a plurality of emitters 112 and detectors 114 positioned about the high-flux power beam 106. In some cases, there is a one-to-one correspondence between each emitter 112 and its corresponding detector 114. In other embodiments, one emitter 112 projects guard beam signals that are detected by a plurality of detectors 114. In these, or other embodiments, a plurality of emitters 112 project guard beam signals that are detected by a single detector 114.

In some cases two or more guard beams from one or more emitters 112 are formed according to different wavelengths. As discussed herein, some foreign objects that may obstruct a high-flux power beam 106 are transparent, some are opaque, some are highly reflective, some scatter light, some diffuse light, and some other foreign objects have different optical properties. By selecting different wavelengths having certain desirable characteristics for some guard beams, foreign object having particular optical properties may be detected. In addition, or in the alternative, the guard beam signals from one in emitter 112 may be distinguished from the guard beam signals of another emitter 112.

At block 516, at least some returns from the guard beam signals emitted at block 514 are received by one or more detectors 114. In some cases, signals that are expected are received; in some cases signals that are expected are not received; and in some cases, signals that are not expected are received.

Processing continues from block 516 to block 518. In some cases, a light curtain is formed in a single-ended arrangement or a double-ended arrangement. Guard beams in the light curtain are emitted by emitters 112, and guard beam signals are detected by detectors 114. In cases where no foreign objects are obstructing a guard beam, an expected guard beam signal is received. In other cases where an expected guard beam signal is not received, a determination is made that a foreign object is obstructing the guard beam. Upon such determination, the high-flux power beam 106 is interrupted. In still other cases, a guard beam having a particular wavelength is emitted by a particular emitter 112. Due to the selected wavelength of the particular guard beam, a corresponding detector does not anticipate receiving a return of the particular guard beam. For example, if the guard beam is unobstructed, the guard beam will be absorbed by a particular wavelength filter. Alternatively, if the guard beam is obstructed, the foreign object obstructing the guard beam may reflect the guard beam where it can be unexpectedly detected by a particular detector 114

At block 520, signals that are expected or are otherwise missing are analyzed. Also at block 520 signals that are expected to be missing but are otherwise received are also analyzed. In cases where expected signals are missing, or in cases where other signals are expected to be missing but are instead unexpectedly detected, processing advances to block 522, where the high-flux power beam 106 is interrupted. Conversely, if all of the expected guard beam signals are received, and no unexpected guard beam signals are received, processing returns to block 512, where transmission of the high-flux power beam 106 continues.

After a high-flux power beam 106 is interrupted at block 522, processing returns to block 514. Unless otherwise diverted, the light curtain continues to operate through blocks 514 to 520. If a previously determined foreign object is no longer detected, and if expected guard beam signals are received while unexpected guard beam signals are not received, the high-flux power beam 106 may again be transmitted. Process 500B is perpetual.

FIG. 5C is a logical flow diagram generally showing a process 500C to distinguish a first guard beam light signal from a second guard beam light signal. The logical flow diagram of process 500C is associated with a particular power beaming system such as power beaming system 100 of FIG. 1. The power beaming system includes a light curtain system having a plurality of M emitters and a plurality of N detectors. M and N are integers. In some cases, such as in process 500C, there are an equal number of emitters and detectors (i.e., M equals N). In other cases, however, there may be different numbers of emitters and detectors (i.e., M does not equal N).

In the process 500C of FIG. 5C, the light curtain system performs a time domain multiplexing of the plurality of M emitters.

At block 532, a synchronization signal is sent to each of the N detectors. The synchronization signal may include a particular pattern of guard beam signal, a time value associated with the emission of a guard beam signal, or some other synchronization signal. After the synchronization signal is sent, processing advances to block 534.

At block 534, a guard beam signal is sent from each emitter, and some or all of the detectors operate to receive an indication of the guard beam signal. In the embodiment, any detector in line of sight of the emitter will expect to receive the emitted guard beam, and if the expected guard beam is not received, the particular detector will form or begin to form a "detection" signal.

In the process 500C, each emitter emits its guard beam signal according to its assigned timeslot. In cooperation, each detector attempts to receive the associated guard beam signal according to the assigned timeslot. Due to the time synchronization at block 532, emitters and corresponding detectors follow a common determined pattern. In some cases, emitters are assigned sequential timeslots. In some cases, timeslots for any given emitter follow a particular pattern. In some cases, timing is dynamically adjusted. For example, the light curtain system may dynamically change assignments to particular timeslots, lengths of particular timeslots, ordering of particular timeslots, or other characteristics. In the processing of block 534, along the lines of FIG. 3A, emitters are assigned to sequential timeslots.

At block 536, received signals are initially analyzed, parsed and stored in a particular data structure such as an array. In some cases, data collection is ongoing as a background task. In other cases, data is collected from each detector in the light curtain, and data is processed in sets. In still other cases, data collection and processing happens in other ways. Processing advances to block 538.

At block 538, one or more return signals, individually or collectively, are compared against particular thresholds, previous signals, predicted signals, or some other values. In this way, guard beam signals that are expected to have a particular amplitude, timing, or other characteristics may be analyzed, and anomalies may be noted in order to determine if a foreign object is impinging on a particular one or more guard beams (e.g., near or impeding a particular one or more guard beams). In some cases, individual guard beams are analyzed. In other cases, collections of guard beam data are analyzed. In these and still other cases, guard beam data may be analyzed historically, predictively, and a normalized fashion, in a weighted fashion, or according to other expectations and contexts of the particular light curtain system.

At block 540, if the analysis and block 538 indicates the presence of a foreign object impinging on one or more guard beams (e.g., near or impeding one or more guard beams), the high-flux power beam 106 may be interrupted. Interrupting the high-flux power beam 106 may include a single switch, an interlock circuit, or some other means.

In the present disclosure, guard beams are passed between emitters and detectors in order to form a light curtain around a high-flux power beam 106. In some embodiments, each emitter 112 sends a light signal (e.g., from an LED or a laser), which is then sensed by a detector 114 (e.g., by a photodiode) when the line-of-sight beam path between the emitter 112 and the detector 114 is clear. If the light signal is blocked, then the absence of the detected light signal is interpreted as an object impinging on the high-flux power beam 106 (e.g., near or impeding the high-flux power beam 106), which causes the generation of a signal that is used to interrupt transmission of the high-flux power beam 106. Certain embodiments described herein include a beam path having a first sub-path between the emitter 112 and a retro-reflector 116, and a second sub-path between the retro-reflector 116 in the detector 114.

The present inventors have recognized that in some cases, a foreign object (e.g., an opaque object such as a hand, for an indoor system, or a vehicle, animal, or bird, for a large-scale outdoor system) may be a substantially reflective foreign object. In embodiments where emitters 112, detectors 114, and retro-reflectors form a single-ended system, it is possible that the substantially reflective foreign object, which has intruded into the line-of-sight beam path, will reflect the guard beam signal strongly enough that the responsive detector 114 will fail to detect the foreign object. This failure by the detector, which is also referred to as a false negative, indicates to the power beaming system that there is no intrusion when in fact there is one. Accordingly, in a case where a high-flux power beam 106 should be interrupted, the safety system falsely determines that no intrusion is present, and transmission of the high-flux power beam 106 dangerously continues.

Figure 6A:
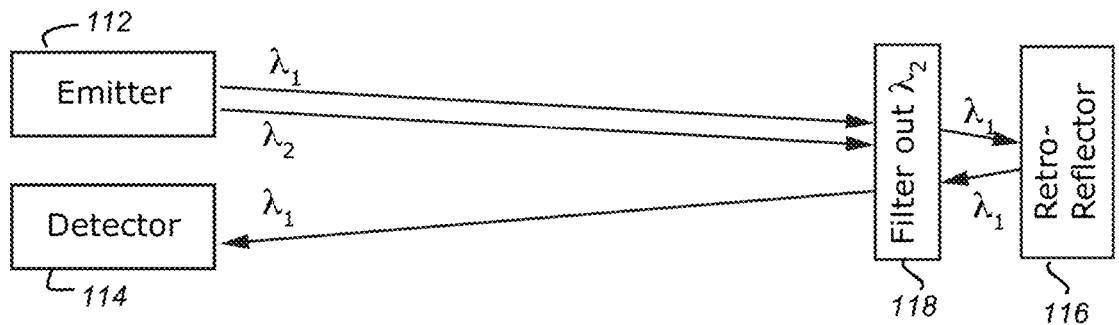
FIG. 6A is a power beaming system embodiment having guard beam emitters operating with signals of different wavelength.
Figure 6B:
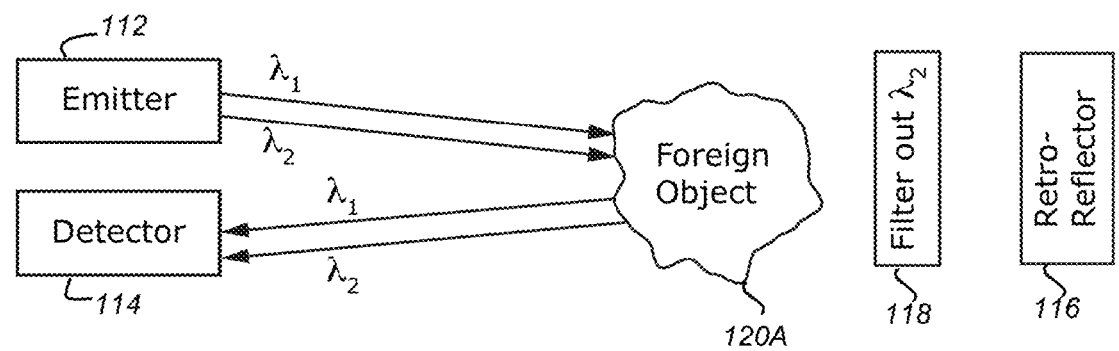
FIG. 6B is the power beaming system embodiment of FIG. 6A with a foreign object intruding on a guard beam.

FIG. 6A is a power beaming system embodiment having guard beam emitters 112 operating with signals of different wavelength. FIG. 6B is the power beaming system embodiment of FIG. 6A with a foreign object 120A intruding on a guard beam. The guard beam emitters 112 of FIGS. 6A-6B participate in a solution that can better distinguish a light signal returned by a retro-reflector 116 and other objects that could intrude in the beam path.

In some embodiments, one or more in emitters 112 of a light curtain safety system transmit at least two separate wavelengths of light in the guard beam light signal. These guard beam signals having the at least two separate wavelengths may be from separate emitters 112 or from the same emitter 112.

The at least two separate wavelengths are described herein as a first wavelength ($\lambda_1$) and a second wavelength ($\lambda_2$) or some variation thereof. Such descriptions are broadly interpreted as two or more signals having different wavelengths unless expressly stated as not having different wavelengths. The embodiments described herein may have signals of multiple wavelengths. Accordingly, while the present disclosure references and describes a first wavelength ($\lambda_1$) and a second wavelength ($\lambda_2$), inventive embodiments along the lines described herein are not so limited and may implement three or more wavelengths. Accordingly, the emitters 112 described herein may generate guard beam signals of any number of wavelengths.

Guard beam signals having at least two separate wavelengths may be produced from a single emitter 112 that is arranged with a suitable spectral bandwidth, such as an incandescent source, a white LED (i.e., which is generally a blue LED with phosphor to convert some blue light to longer wavelengths), or some other signal source. In the alternative, or in addition, guard beam signals having at least two separate wavelengths may be produced from two or more emitters 112, each arranged to produce a signal having a particular wavelength.

In some embodiments, an emitter 112 is arranged as a broadband emitter that may be combined or otherwise arranged to cooperate with one or more narrowband filters. The one or more narrowband filters may be either transmissive filters or blocking filters, and the emitter 112 and filter combination is arranged to produce a desired emitted spectrum. In some embodiments, a single source may have a variable wavelength, and in such cases, a single source (e.g., an emitter 112) may generate and transmit different wavelengths at different times.

The target reflector, which is shown in FIGS. 6A-6B as a discrete retro-reflector 116, but which also may be retroreflective tape, a specular flat or curved mirror, a diffusing surface, or some other means, is configured to reflect at least one emitted wavelength or wavelength range differently from at least one other wavelength or wavelength range. The target reflector may include a wavelength filter 118, such as an interference filter, dye filter, or colored-glass filter.

Preferentially, the two wavelengths of the emitted guard beam signals are separated by a small amount (e.g., $(\lambda 1-\lambda 2)/\lambda 1<0.1$)) so that most materials other than the target reflector will reflect the two wavelengths similarly. The target reflector on the other hand includes a narrow-band wavelength filter 118, such as a multilayer interference filter, which selectively transmits or blocks guard beam signals having one of the two wavelengths.

The narrow-band wavelength filter functionality may be integrated directly with the target reflector as a material or coating with wavelength-dependent reflectivity or transmission. For example, the wavelength filter 118 may be implemented as a glass cover which significantly attenuates blue light compared to red light, preferably with a sharp transition in wavelength between transmission and attenuation. In some embodiments, the target reflector will reflect signals formed with a first wavelength ($\lambda_1$) without attenuation, and will either completely absorb signals formed with a second wavelength ($\lambda_2$), or reflect such signals formed with the second wavelength ($\lambda_2$) with substantial (e.g., 10×) attenuation.

In some embodiments, detectors 114 are directly sensitive to the wavelength of the detected light. For example, a detector 114 in some embodiments may comprise two photodiodes covered with filters for two different wavelengths. As another example, a detector 114 may comprise two photodiodes with one photodiode unfiltered (i.e., to allow detection of signals formed with either the first wavelength or the second wavelength), and a second photodiode filtered (i.e., to detect only one of the two wavelengths).

In still other embodiments, the two wavelengths are made distinguishable by another means. For example, in some cases, the two wavelengths may be emitted at different times (e.g., alternating between a longer and a shorter wavelength at, for example, 10 kHz). In some cases, signals can be pulsed with different wavelengths at different pulse rates. In some cases, signals can be modulated with different wavelengths at different frequencies (e.g., 100 kHz and 150 kHz, or 100 kHz and 1 MHz). In this way, the output of a detector 114 can be electronically filtered to produce at least two outputs (e.g., intensity for wavelength 1 [$I_1$] and intensity for wavelength 2 [$I_2$]), and the outputs can be processed to produce, for example, total intensity ($I_1+I_2$) and one separate intensity $I_1$, total intensity ($I_1+I_2$) and intensity ratio ($I_1/I_2$), or some other combination.

As shown in the embodiment of FIG. 6A, a guard beam signal formed with the first wavelength ($\lambda_1$) is emitted by emitter 112 and passes through the wavelength filter 118. The guard beam formed with the first wavelength ($\lambda_1$) is reflected by the retro-reflector 116, passes back through the wavelength filter 118, and is detected by one or more detectors 114. In contrast to the guard beam signal formed with the first wavelength ($\lambda_1$), the guard beam signal formed with the second wavelength ($\lambda_2$) is blocked by the wavelength filter 118.

In FIG. 6B, a foreign object 120A blocks the line-of-sight path between an emitter 112 and the detector 114, which includes an expected first sub-path from emitter 112 to retro-reflector 116, and an expected second sub-path from retro-reflector 116 to detector 114. In this case, the foreign object 120A breaks the two line-of-sight sub-paths between the emitter 112 and the retro-reflector 116 and between the retro-reflector 116 and the detector 114. The foreign object 120A reflects both guard beam signals (i.e., the guard beam signal formed with the first wavelength ($\lambda_1$) and the guard beam signal formed with the second wavelength ($\lambda_2$)), and both guard beams are reflected directly to the detector 114.

In the embodiment of FIG. 6B, the detector 114 is arranged to recognize guard beam signals formed with both the first wavelength ($\lambda_1$) and the second wavelength ($\lambda_2$). Despite the ability to recognize signals with both wavelengths, the detector 114 is only expected to receive guard beam signals formed with the first wavelength ($\lambda_1$), because guard beam signals formed with the second wavelength ($\lambda_2$) are expected to be attenuated by wavelength filter 118 and not reflected back to the detector 114. When, however, detector 114 does receive a guard beam signal formed with the second wavelength ($\lambda_2$), the detector 114 or an associated controller determines that a substantially reflective foreign object 120A has impinged (e.g., impeded) the line-of-sight path to or from the retro-reflector 116. Based on such determination, the transmission of a high-flux power beam 106 is interrupted.

The interpretation that a guard beam signal (e.g., guard beam signal formed with the second wavelength ($\lambda_2$) in FIG. 6B) unexpectedly received at a detector 114 is caused by a reflective foreign object 120A impinging on a high-flux power beam 106 (e.g., near or impeding a high-flux power beam 106) may be made with a processor 406 (FIGS. 4A, 4B), which may be configured as an executive safety control device or similar control circuit. For example, a control circuit coupled to one or more detectors may be arranged to respond to a decrease in detected intensity of the detected light at the strongly-reflected wavelength. In these or other embodiments, the control circuit may be arranged to respond to an increase in intensity of detected light at the poorly-reflected wavelength. In these or still other embodiments, the control circuit may be arranged to respond to a change in a ratio between detected light signals at the two wavelengths.

In the embodiments described herein, a decrease in intensity at the strongly-reflected wavelength indicates that the guard beam has been blocked, such as by an opaque, light-absorbing object entering the beam. An increase in intensity or change in ratio indicates that the subject guard beam has been fully or at least partially blocked from reaching a corresponding target reflector, but the guard beam is being reflected or scattered back from an object, such as a hand or piece of clothing, which has a substantially different ratio of reflectivities at the two wavelengths than the target reflector.

In the present disclosure, light or sensitivity to light at a particular wavelength (e.g., guard beam signals formed with the first wavelength ($\lambda_1$) and guard beam signals formed with the second wavelength ($\lambda_2$)) may be understood as light or sensitivity to light at a single wavelength or as a spectral distribution of light or sensitivity to light in a band of wavelengths around the particular wavelength.

Figure 7A:
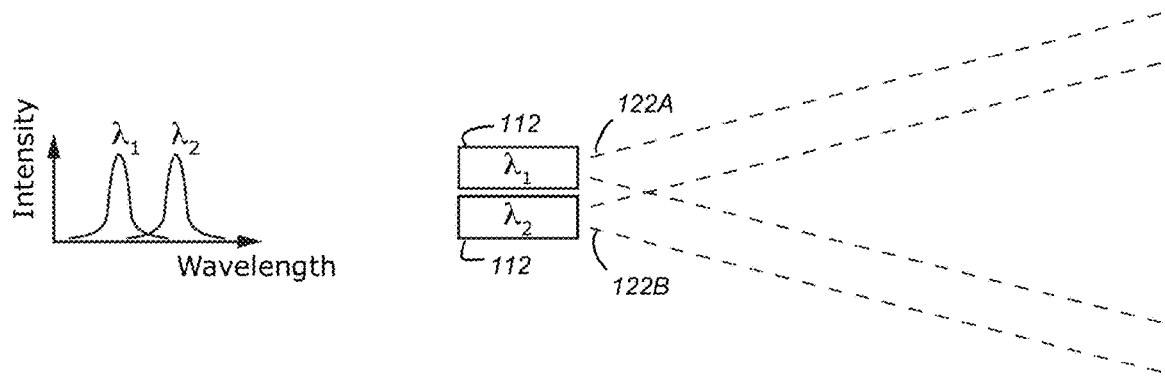
FIGS. 7A-7E are guard beam emitter embodiments.

FIGS. 7A-7E are guard beam emitter 112 embodiments of the types described in the present disclosure. The emitters 112 of FIGS. 7A-7E may be flexibly arranged to provide guard beam signals formed with one or more particular wavelengths. For example, in FIG. 7A, two emitters 112 each provide a particular guard beam signal. A first one of the emitters 112 provides a first guard beam signal 122A formed with a first wavelength ($\lambda_1$), and a second one of the emitters 112 provides a second guard beam signal 122B formed with a second wavelength ($\lambda_2$). In the embodiment of FIG. 7A, the two emitters 112 are positioned in proximity to each other such that the guard beam signal of each emitter 112 forms a cone, and the cones of each of the two emitters 112 overlap. In this way, a foreign object that crosses a line-of-sight of the first guard beam will also very likely cross a line-of-sight of the second guard beam. A guard beam signal intensity plot in FIG. 7A illustrates a substantially equal amplitude (i.e., intensity) of the first and second guard beam signals, and the signal intensity plot also illustrates the relative closeness of the first wavelength ($\lambda_1$) to the second wavelength ($\lambda_2$).

Figure 7B:
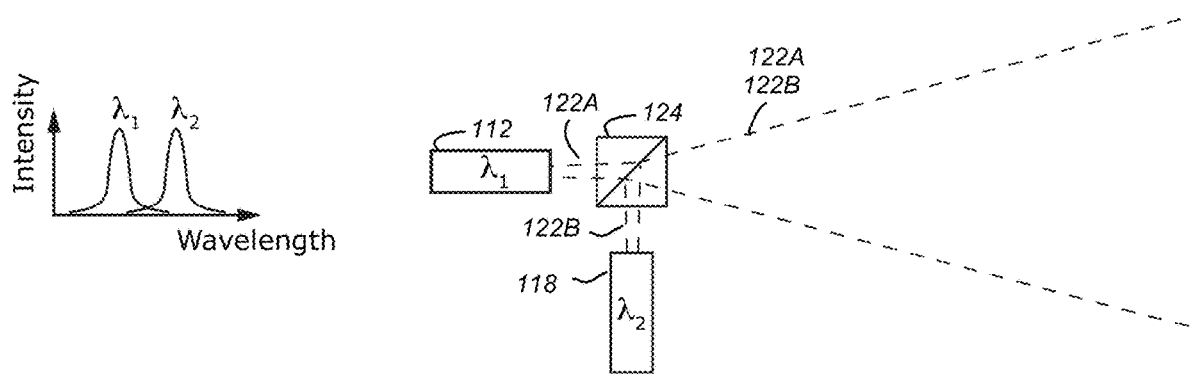

In FIG. 7B, along the lines of the embodiment of FIG. 7A, two emitters 112 each provide a particular guard beam signal. A first one of the emitters 112 provides a first guard beam signal 122A formed with the first wavelength ($\lambda_1$), and a second one of the emitters 112 provides a second guard beam signal 122B formed with the second wavelength ($\lambda_2$). A dichroic means 124 such as a dichroic mirror, dichroic lens, or some other dichroic structure gathers, redirects, and otherwise combines the first and second guard beam signals. In this way, a foreign object impinging on a high-flux power beam 106 (e.g., moving near or impeding a high-flux power beam 106) by crossing into a light curtain formed in part by the first guard beam signal will also cross into the second guard beam signal. In such embodiments as those of FIGS. 6A and 6B and described in the present disclosure, the foreign object which impacts both the first and second guard beam will be detected.

Figure 7C:
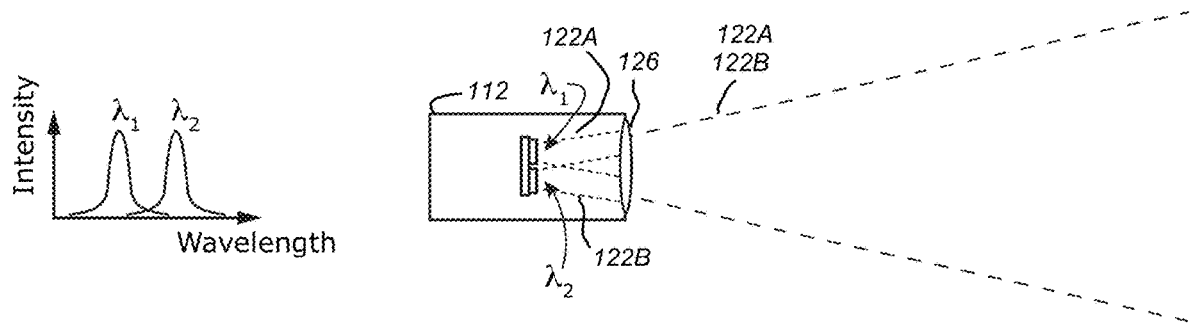

In FIG. 7C, an emitter 112 is arranged to produce a first guard beam signal 122A formed with the first wavelength ($\lambda_1$) and a second guard beam signal 122B formed with the second wavelength ($\lambda_2$). In the embodiment, the first and second guard beam signals are passed through a common projection lens 126. Along the lines of FIGS. 7A and 7B, the emitted signal cone of the first and second guard beam signals overlap. When the a foreign object crosses into the signal path of one guard beam, the foreign object will also cross into the signal path of the other guard beam in cases where a corresponding detector 114 is configured to receive a signal having a particular wavelength, but not expecting to receive the signal with a particular wavelength, the foreign object will be detected.

Figure 7D:
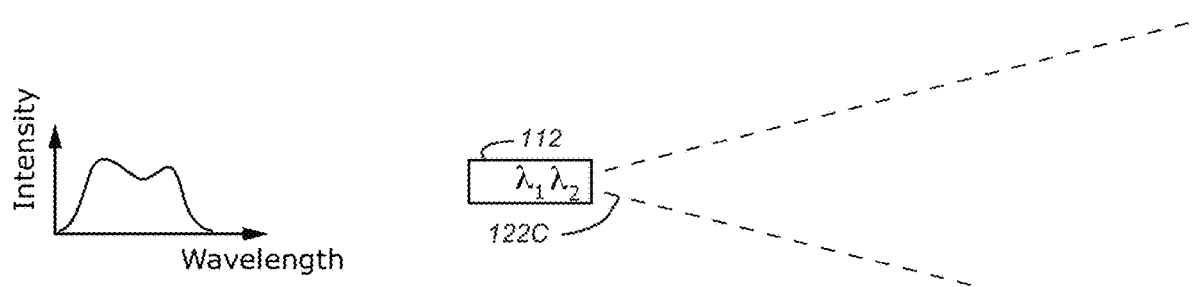
Figure 7E:
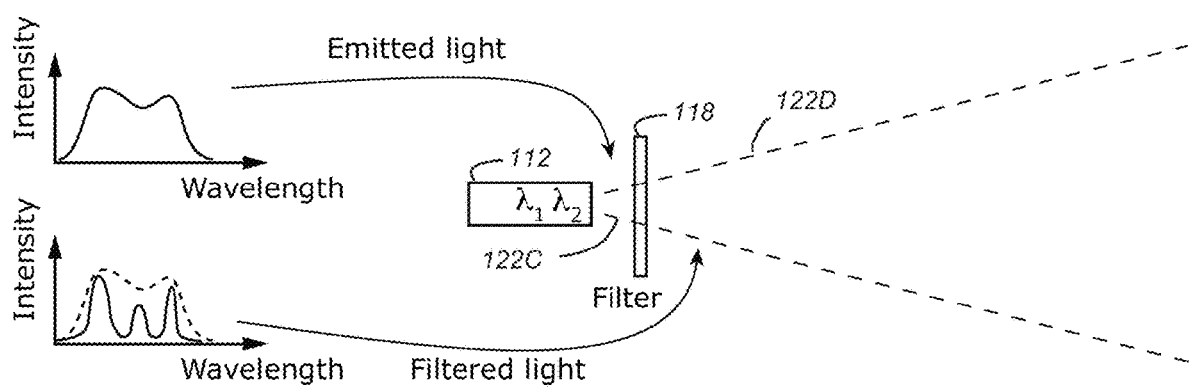

FIG. 7D illustrates an emitter 112 arranged to produce a dual wavelength guard beam signal 122C formed with both a first wavelength ($\lambda_1$) and a second wavelength ($\lambda_2$). In FIG. 7E, the emitter 112 of FIG. 7D is again employed to produce the dual-wavelength guard beam signal 122C. In FIG. 7D, the dual-wavelength guard beam signal 122C is emitted toward one or more corresponding detectors 114. In FIG. 7D, the dual-wavelength guard beam signal 122C is passed through a particular wavelength filter 118 to form a filtered dual-wavelength guard beam signal 122D, which is emitted toward one or more corresponding detectors 114. Corresponding intensity plot diagrams are presented in FIGS. 7D and 7E to illustrate generated signals.

The light curtain generation guard beam emitter 112 embodiments of FIGS. 7A-7E may be provided individually or in any desirable combination to achieve the benefits described in the present disclosure. Signals emitted by the emitters 112 of the embodiments of FIGS. 7A-7E are distinguishable from each other, and detectors 114, which may be arranged with cooperative controllers (e.g., processor 406 of FIG. 4A), are used to distinguish one or more particular emitted signals amongst other guard beam signals, ambient light, man-made light, and other electromagnetic signals which would otherwise affect conventional systems. The use of these embodiments prevents a detection of false negatives, which arise when a foreign object that is impinging on a high-flux power beam 106 (e.g., near or impeding a high-flux power beam 106) goes undetected, or is not detected as early as otherwise possible.

The present disclosure describes guard beams that are passed between emitters 112 and detectors 114 in order to form a light curtain around a high-flux power beam 106. The present disclosure also describes embodiments wherein, when a guard beam signal is blocked, the absence of the detected light signal is interpreted as an object impinging on the high-flux power beam 106 (e.g., near or impeding the high-flux power beam 106), which causes an interruption to the transmission of the high-flux power beam 106. Certain embodiments describe a guard beam path having first and second sub-paths between an emitter 112, a detector 114, and an intervening retro-reflector 116.

The present inventors have recognized that in some cases, a foreign object may be a substantially light transparent foreign object. In embodiments where emitters 112, detectors 114, and retro-reflectors form a single-ended system, it is possible that the substantially light transparent foreign object, which has intruded into the line-of-sight beam path, will permit the guard beam signal to pass to its corresponding detector 114. In this case, the responsive detector 114 will again fail to detect the foreign object (i.e., a false negative) and indicate to the power beaming system that there is no intrusion when in fact there is one. Accordingly, in a case where a high-flux power beam 106 should be interrupted, the safety system falsely determines that no intrusion is present, and transmission of the high-flux power beam 106 dangerously continues.

One danger in power beaming systems recognized by the inventors is that when a transparent object, such as a sheet of glass or plastic, enters the protected space behind a light curtain, reflections of a high-flux power beam 106 off of the transparent object will present a hazard to humans, animals, property, or other objects. In the case of laser power beaming, for example, a glass surface of a foreign object may reflect a significant portion of the power beam (e.g., up to 4% or more) out from the projected beam path, thereby presenting a severe eye hazard. Worse still, since a sheet of glass, for example, has two surfaces (i.e., a first surface where a power beam enters the sheet of glass and a second surface where the power beam exits the sheet), the amount of power beam flux dangerously reflected outward may be doubled (e.g., up to 8% or more). While the introduction of such a transparent object is less likely than introducing an opaque object, certain cases where such an event would occur, for example by accident or as a result of a deliberate attempt to defeat the protection system, have been contemplated.

In some embodiments of the present disclosure, a beam-break or light-curtain safety system operates with a guard beams formed with the plurality of wavelengths. In some cases, a first wavelength ($\lambda_1$) is in the visible or near-infrared range. In these cases, a second wavelength ($\lambda_2$) is selected to be one that is significantly absorbed by common transparent materials, such as silica-based glasses, common plastics (e.g., acrylics and polycarbonates), and other such materials. Preferred wavelengths for guard beams formed with a second wavelength ($\lambda_2$) include signals in the ultraviolet B (290-315 nm) range, signals in the mid-infrared (2800-5000 nm) range, and other such signals that are strongly absorbed by common types of glass and plastic. In some cases, signals are formed with a different wavelength so as to detect selected UV-transmitting glasses and plastics, which do transmit UV-B.

In some cases, emitters and detectors that are arranged to emit and detect guard beam signals formed with the second, transparent-detection wavelength are configured and positioned in the similar ways as the emitters and detectors that are arranged to emit and detect card beam signals formed with the first wavelength ($\lambda_1$). In other cases, the emitters and detectors arranged to emit and detect guard beam signals formed with the second wavelength ($\lambda_2$) are configured and positioned differently. Emitters, for example, that are associated with guard beam signals formed with the second wavelength ($\lambda_2$) may be physically located further apart from other such emitters. These emitters can be spaced more widely because small transparent objects, which may otherwise pass between widely spaced guard beams, are likely to refract light and thus disrupt the visible/near-IR beams. Alternatively, very hazardous objects (e.g., large, flat sheets of glass or plastic) will be large enough to still interrupt guard beams that are spaced more widely apart. Along these lines, detectors that are configured to detect guard beam signals formed with the second wavelength ($\lambda_2$) may be similarly spaced more widely then detectors responsive to light signals formed with other wavelengths.

Figure 8:
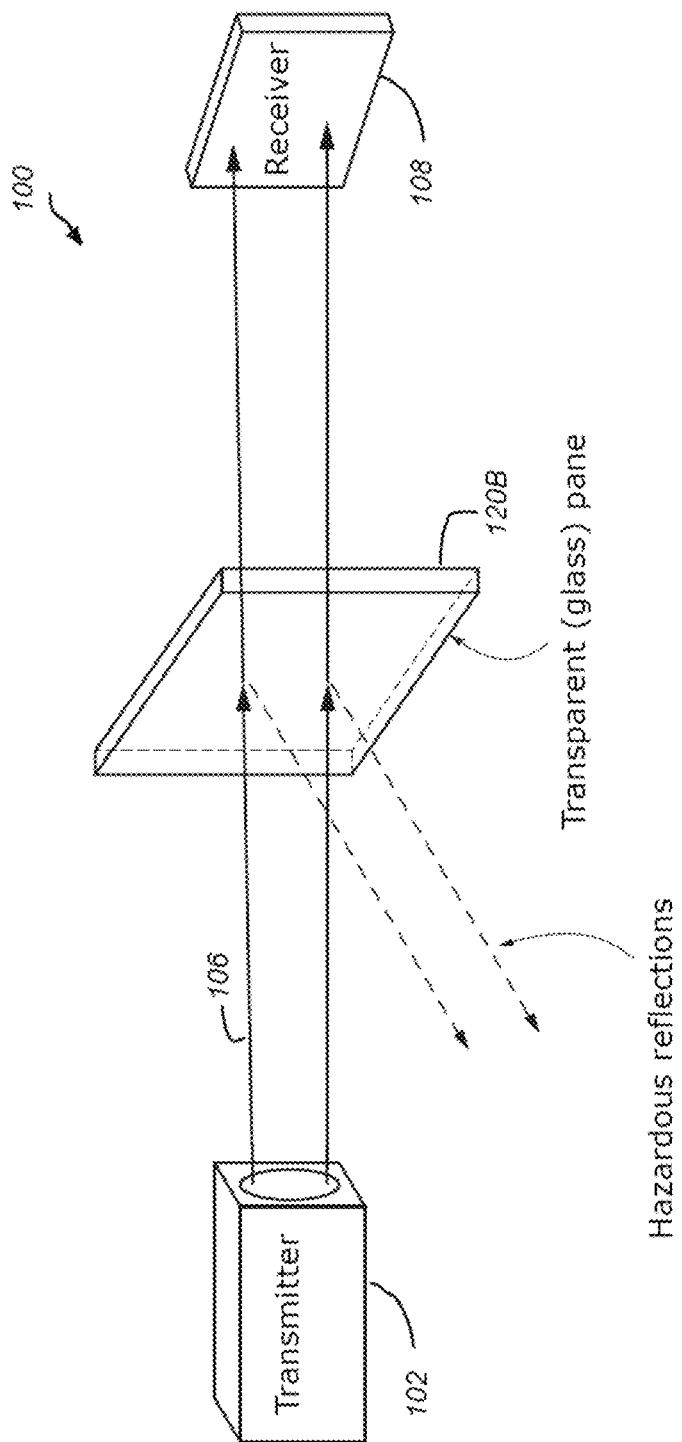
FIG. 8 is a power beaming system having a light-transparent foreign object intruding on a high flux power beam.

FIG. 8 is a power beaming system 100 having a light-transparent foreign object 120B intruding on a high-flux power beam 106. In this embodiment, the light curtain is not illustrated for simplicity. In this embodiment, the transmission unit 102 generates and projects the high-flux power beam 106 toward a reception unit 108. The transparent object 120B impinges on the high-flux power beam 106 (e.g., impedes the high-flux power beam 106), causing hazardous reflections from both the first surface of the transparent object 120B closest to the transmission unit 102, and from the second surface of the transparent object 120B, furthest from the transmission unit 102.

In some light curtain embodiments, it may be desirable to place the emitters 112 and detectors 114 that are arranged to emit and detect guard beam signals formed with the second wavelength ($\lambda_2$) at opposite ends of the protected area. Such a double-ended arrangement may be implemented even if emitters 112 and detectors 114 that are arranged to emit and detect guard beam signals formed with the first wavelength ($\lambda_1$) are configured in a single-ended arrangement (i.e., where emitter/detector assemblies are located at one end and retro-reflective structures are located at the other end). These double-ended arrangements may be implemented due to a limited availability of UV or mid-IR retro-reflectors or for other reasons.

Conversely, in some embodiments, it may be desirable to place the emitters 112 and detectors 114 that are arranged to emit and detect guard beam signals formed with the second wavelength ($\lambda_2$) at one end and use a UV or mid-IR retro-reflector at the other end. Such a single-ended arrangement may be used in order to pass the guard beam formed at the second wavelength ($\lambda_2$) through a possible obstacle two times, thereby increasing the absorption length and attenuation of the guard beam signal due to a partially-absorbing obstacle.

Figure 9A:
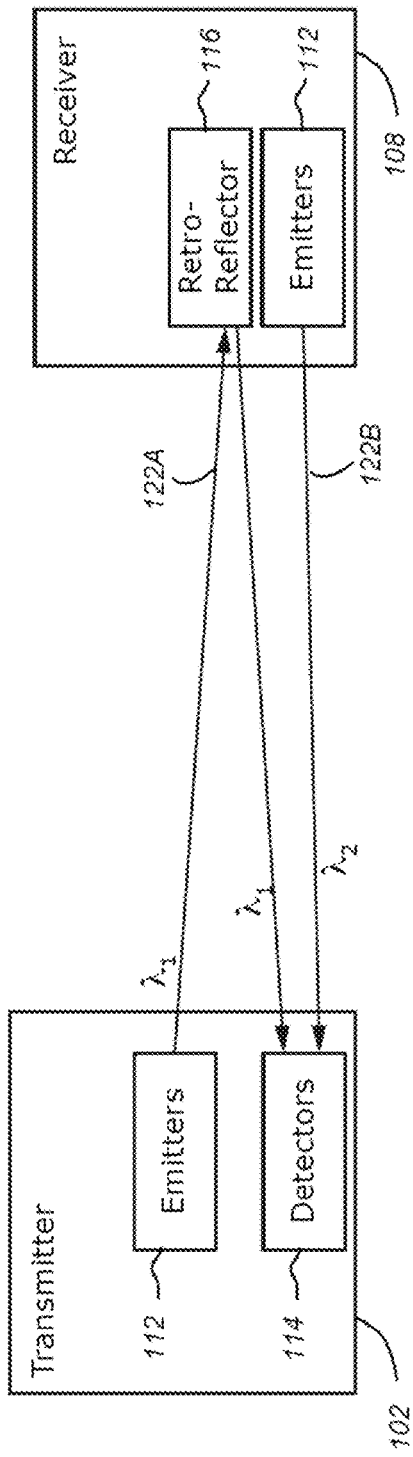
FIGS. 9A-9B are a power beaming system embodiment arranged to detect light-transparent foreign objects.
Figure 9B:
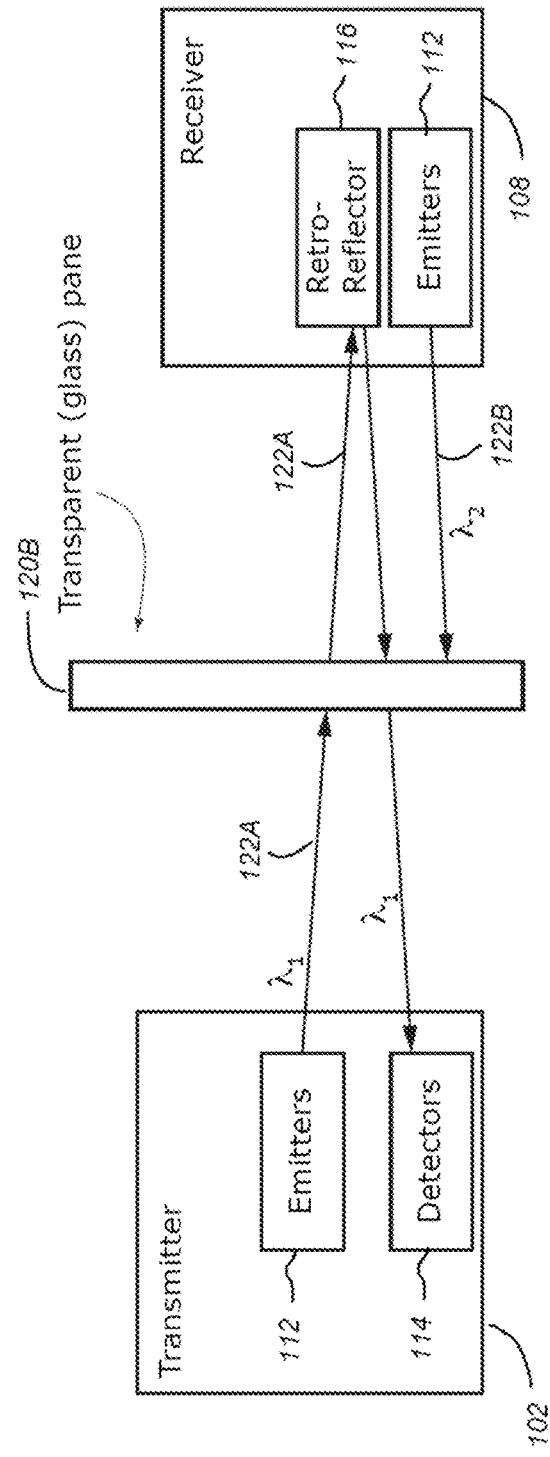

FIGS. 9A-9B are a power beaming system embodiment arranged to detect light-transparent foreign objects. In FIG. 9A, a transmission unit 102 is arranged to generate and project a high-flux power beam 106 (not shown) toward a reception unit 108. In the embodiment of FIG. 9A, two guard beams of a light curtain are illustrated. A first emitter 112 and a first detector 114 are located at the transmission unit 102. Together, the first emitter 112 and first detector 114 form a single-ended system that communicates a first guard beam signal 122A formed at the first wavelength ($\lambda_1$) from the first emitter 112 along a first sub-path to a first retro-reflector 116, and back from the first retro-reflector 116 along a second sub-path to the first detector 114. Also in FIG. 9A, a second emitter 112 is located at the reception unit 108. The second emitter 112 is arranged as a double-ended guard beam system with the first detector 114 at the transmission unit 102. The second emitter unit 112 communicates a second guard beam 122B signal formed with the second wavelength ($\lambda_2$) directly to the first detector 114, which is arranged to receive both the first guard beam signal 122A and the second guard beam signal 122B.

FIG. 9B illustrates the same portion of a dual-wavelength light curtain as illustrated in FIG. 9A. In FIG. 9B, however, a substantially transparent foreign object 120B (i.e., a transparent (glass) pane) is now obstructing the first and second guard beams. In FIG. 9B, the substantially transparent foreign object 120B partially attenuates the first guard beam signal 122A and completely blocks the second guard beam signal 122B. In a conventional guard beam system, a guard beam would substantially pass through the substantially transparent foreign object 120B and provide a false negative indication that the high-flux power beam was safe to transmit. Conversely, in the embodiment of FIG. 9B, the attenuation of the first guard beam 122A and absence of the second guard beam 122B at the detector 114 are used to recognize (i.e., determine) the presence of the substantially transparent foreign object 120B, which indication is used to interrupt transmission of the high-flux power beam 106.

A dual-wavelength light curtain system may be used in conjunction with a sensitive threshold detector 114 arranged to detect a guard beam signal formed at the first wavelength ($\lambda_1$). These embodiments may be implemented because many transparent objects (e.g., glass objects, plastic objects, and the like) will reflect at least several percent of the guard beam signal formed at the first wavelength ($\lambda_1$) per surface, and thus, unless the transparent object is exactly perpendicular to the light-curtain beams, the transparent object will attenuate the guard beam by several percent (e.g., 8% or more) on a single pass or twice as much (e.g., 16% or more) on two passes. Accordingly, using attenuation of the guard beam formed at the first wavelength ($\lambda_1$) alone to detect transparent obstacles may be unsatisfactory due to noise or slow variations in the detected light intensity, which will cause excessive false alarms if sensitive threshold detector 114 is set to reliably detect low levels of beam attenuation. However, strong attenuation of the guard beam formed with the second wavelength ($\lambda_2$) combined with a small attenuation of the guard beam formed with the first wavelength ($\lambda_1$) may provide an acceptably reliable indicator that the attenuation of the guard beam formed with the second wavelength ($\lambda_2$) was due to an obstacle and not due to emitter or detector problems, atmospheric scattering in the UV range, or other effects that would disrupt the guard beam formed with the second wavelength ($\lambda_2$).

In some cases, foreign objects may be partly-transmissive even in the mid-IR rage, or beams may be larger, or diffraction may have more tendency to "fill in" blocked beams. In these cases, even if a foreign object obstructs a guard beam, it may be desirable to select a change-in-signal threshold differently for, particularly, a mid-IR system than for a visible/near-IR system.

Figure 10A:
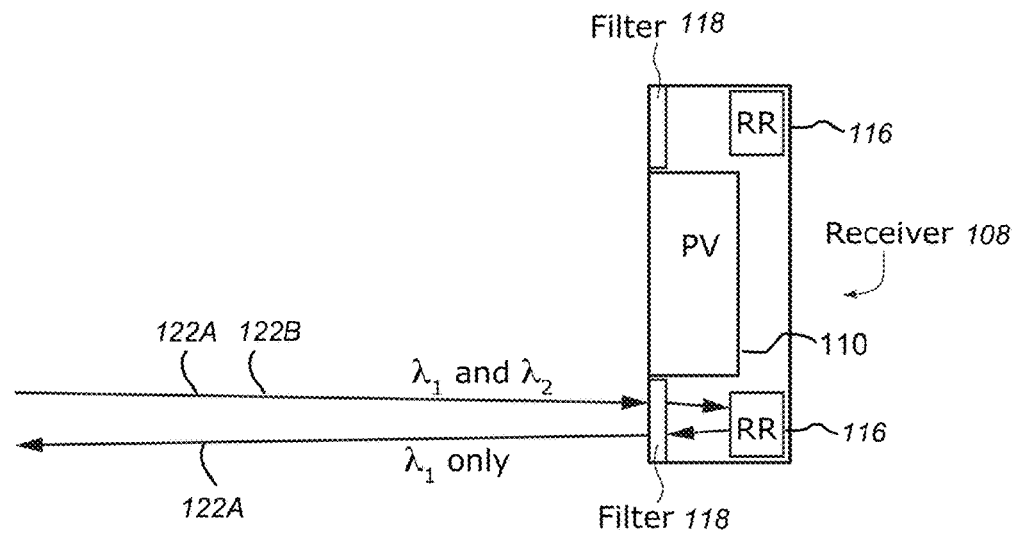
FIGS. 10A-10B are a high-flux power beam receiver embodiment arranged to detect a reflective or transparent foreign object and corresponding intensity profiles for the embodiment at various points in the receiver.
Figure 10B:
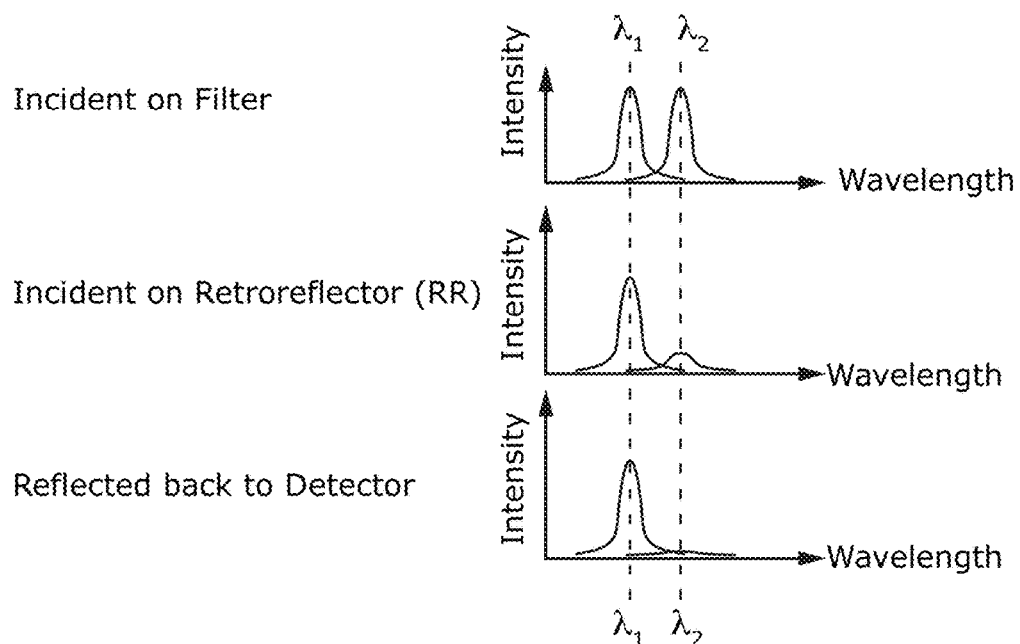

FIGS. 10A-10B are a high-flux power beam receiver embodiment arranged to detect a reflective foreign object and corresponding intensity profiles for the embodiment at various points in the receiver. The embodiment of FIGS. 10A-10B is implemented as a dual-wavelength single-ended light curtain wherein one or more emitters 112 (not shown) generate and emit a first guard beam signal 122A formed at the first wavelength ($\lambda_1$) and a second guard beam signal 122B formed at the second wavelength ($\lambda_2$). One or more detectors 114 (not shown) are arranged to detect signals at the first wavelength ($\lambda_1$) and the second wavelength ($\lambda_2$). At the reception unit 108, a power beam receiver 110 is arranged to receive a high-flux power beam 106 (not shown). A plurality of retro-reflectors 116 are arranged about the power beam receiver 110. Each retro-reflector 116 is positioned behind a particular wavelength filter 118. In the embodiment of FIG. 10A, the first guard beam 122A and second guard beam 122B travel substantially the same path toward the reception unit 108. In this case, when a foreign object impinges on a first guard beam 122A (e.g., impedes a first guard beam 122A), the foreign object will also impinge on a second guard beam 122B (e.g., impede a second guard beam 122B). In this way, the dual-wavelength single-ended light curtain embodiment of FIG. 10A is arranged to detect any foreign objects that impinge on the high-flux power beam 106 (e.g., come near or impede the high flux power beam 106), wherein the foreign objects may be any type of opaque objects, substantially reflective objects, light transparent objects, or the like.

In the present case of FIGS. 10A-10B, the second wavelength ($\lambda_2$) and the wavelength filter 118 may be cooperatively selected such that the second guard beam signal 122B will be attenuated when it reaches the reception unit 108. In this case, if the second guard beam signal 122B is obstructed by a reflective object, then the second guard beam signal 122B will unexpectedly be returned to a detector, and the opaque (i.e., reflective) object will be detected.

The intensity plots of FIG. 10B illustrate particular signal intensities of the first guard beam signal 122A formed at the first wavelength ($\lambda_1$) and the second guard beam signal 122B formed at the second wavelength ($\lambda_2$). In the top-most signal intensity plot, if neither guard beam is obstructed, both the first guard beam signal 122A and the second guard beam signal 122B are incident upon filter 118. Correspondingly, in the middle signal intensity plot, it is shown that the first guard beam signal 122A passes through the wavelength filter 118 and strikes the retro-reflector 116. In contrast, in the middle signal intensity plot, the second guard beam signal 122B is attenuated by the wavelength filter 118, and the amplitude of the second guard beam signal 122B is very low. In the bottom-most signal intensity plot of FIG. 10B, the first guard beam signal 122A is reflected back to a corresponding detector 114 (not shown). Concurrently, the second guard beam signal 122B is even further attenuated by the wavelength filter 118, and the amplitude of the second guard beam signal 122B is barely detectable.

Certain words and phrases used in the present disclosure are set forth as follows. The terms "include" and "comprise," as well as derivatives thereof, mean inclusion without limitation. The term "or," is inclusive, meaning and/or. The phrases "associated with" and "associated therewith," as well as derivatives thereof in all grammatical forms, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, such a device may be implemented in hardware, firmware, or software, or some combination of at least two of the same. The functionality associated with any particular controller may be centralized or distributed, whether locally or remotely. Other definitions of certain words and phrases may be provided within this patent document. Those of ordinary skill in the art will understand that in many, if not most instances, such definitions apply to prior as well as future uses of such defined words and phrases.

Where one or more figures included in the present disclosure illustrates a data flow diagram, the illustrated process is a non-limiting process that may be used by embodiments of high flux power beam or field systems. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

In some cases, the figures in the present disclosure illustrate portions of one or more non-limiting computing device embodiments such as the transmission unit 102 and the reception unit 108. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry. In addition, or in the alternative, the computing device embodiments may be electronic circuits formed to carry out operations of a finite state machine.

Processors, such as those that may be employed in the transmission unit 102 (e.g., executive controller 404) and the reception unit 108, may include central processing units (CPU's), microcontrollers (MCU), digital signal processors (DSP), application specific integrated circuits (ASIC), and the like. The processors interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, embodiments describe software executable by the processor and operable to execute certain ones of the method acts.

As known by one skilled in the art, a computing device has one or more memories such as memory 408, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

When so arranged as described herein, each computing device may be transformed from a generic and unspecific computing device to a combination device comprising hardware and software configured for a specific and particular purpose.

Database structures, if any are present in the power beaming system embodiment 100 or in other embodiments, may be formed in a single database or multiple databases. In some cases hardware or software storage repositories are shared amongst various functions of the particular system or systems to which they are associated. A database may be formed as part of a local system or local area network. Alternatively, or in addition, a database may be formed remotely, such as within a "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

Buttons, keypads, computer mice, memory cards, serial ports, bio-sensor readers, touch screens, and the like may individually or in cooperation be useful to an operator of the power beaming system embodiment 100. The devices may, for example, input control information into the system. Displays, printers, memory cards, LED indicators, temperature sensors, audio devices (e.g., speakers, piezo device, etc.), vibrators, and the like are all useful to present output information to the operator of the power beaming system embodiment 100. In some cases, the input and output devices are directly coupled or otherwise electronically coupled to a processor or other operative circuitry. In other cases, the input and output devices pass information via one or more communication ports (e.g., RS-232, RS-485, infrared, USB, etc.)

Where a range of values is provided, it is understood that each intervening value, to the tenth of the unit of the lower limit unless the context clearly dictates otherwise, between the upper and lower limit of that range and any other stated or intervening value in that stated range is encompassed within the invention. That the upper and lower limits of these smaller ranges may be independently included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

As used in the present disclosure, the term "module" refers to an application specific integrated circuit (ASIC), an electronic circuit, a processor and a memory operative to execute one or more software or firmware programs, combinational logic circuitry, or other suitable components (i.e., hardware, software, or hardware and software) that provide the functionality described with respect to the module.

A processor (i.e., a processing unit), as used in the present disclosure, refers to one or more processing units individually, shared, or in a group, having one or more processing cores (e.g., execution units), including central processing units (CPUs), digital signal processors (DSPs), microprocessors, micro controllers, state machines, and the like that execute instructions. In the present disclosure, the terms processor in any of its grammatical forms is synonymous with the term controller.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

The terms, "real-time" or "real time," as used interchangeably herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds, milliseconds, seconds, minutes or some other time frame as the context of the term's use implies), and that the activity may be performed on an ongoing basis (e.g., stopping the transmission of a high flux power beam or field). An example of an activity that is not real-time is one that occurs over an extended period of time (e.g., hours, days, weeks, months, years, or some other time frame as the context of the term's use implies) or that occurs based on intervention or direction by a person or other activity.

Unless the context requires otherwise, throughout the specification and claims which follow, the word "comprise" and variations thereof, such as, "comprises" and "comprising" are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system to detect obstacles to a power beam using guard beam signals, comprising:
a plurality of emitters and a plurality of detectors that form a light curtain patterned about the power beam, the plurality of emitters surrounding the power beam having an emitter module including:
one or more first emitters arranged to emit a first guard beam signal at a first wavelength, the first guard beam signal emitted in proximity to the power beam; and
one or more second emitter arranged to emit a second guard beam signal at a second wavelength, wherein the first wavelength is different than the second wavelength, the second guard beam signal emitted in proximity to the first signal;
the plurality of detectors surrounding the power beam, the plurality of detectors including:
one or more first detectors arranged to respond to the first guard beam signal emitted by the one or more first emitters the first wavelength; and
one or more second detectors arranged to respond to the second guard beam signal emitted by the one or more second emitters the second wavelength; and
a controller that directs operations of one or more first detectors and one or more second detectors, wherein the controller determines that an unexpected change in a number of detected wavelength signals is indicative of a foreign object near or impeding the power beam, and wherein the controller further generates a responsive signal that causes transmission of the power beam to be stopped in response to the determination of the unexpected change.

2. The system according to claim 1, wherein the determined change in the number of detected wavelength signals comprises a presence of two guard beam signals when only one guard beam signal was expected.

3. The system according to claim 1, wherein the determined change in the number of detected wavelength signals comprises a presence of only one guard beam signal when two guard beam signals were expected.

4. The system according to claim 1, wherein the first guard beam signal at the first wavelength and the second guard beam signal at the second wavelength are emitted at different times.

5. The system according to claim 1, wherein the first guard beam signal at the first wavelength and the second guard beam signal at the second wavelength are pulsed at different pulse rates.

6. The system according to claim 1, wherein the first guard beam signal at the first wavelength and the second guard beam signal at the second wavelength are produced at different intensity levels.

7. The system according to claim 1, wherein the plurality of emitters and the plurality of detectors are co-located near each other, with the emitted signals being reflected from reflective structures at an other end of the power beam back to the plurality of detectors.

8. The system according to claim 1, wherein one or more first detectors are arranged with one or more first filters that are particular to the first wavelength associated with the one or more first emitters, and wherein one or more second detectors are arranged with one or more second filters that are particular to the second wavelength associated with the one or more second emitters.

9. A system to detect obstacles to a power beam using guard beam signals, comprising:
a plurality of emitters and a plurality of detectors that form a light curtain patterned about the power beam, the plurality of emitters surrounding the power beam having an emitter module including:
one or more first emitters arranged to emit a first guard beam signal at a first wavelength, the first guard beam signal emitted in proximity to the power beam; and
one or more second emitter arranged to emit a second guard beam signal at a second wavelength, wherein the first wavelength is different than the second wavelength, the second guard beam signal emitted in proximity to the first signal;
the plurality of detectors surrounding the power beam, the plurality of detectors arranged to respond to the first guard beam signal emitted by the one or more first emitters at the first wavelength and arranged to respond to the second guard beam signal emitted by the one or more second emitters at the second wavelength; and a controller that directs operations of the plurality of detectors, wherein the controller determines that an unexpected change in a number of detected wavelength signals is indicative of a foreign object near or impeding the power beam, and wherein the controller further generates a responsive signal that causes transmission of the power beam to be stopped in response to the determination of the unexpected change.

10. The system according to claim 9, wherein the determined change in the number of detected wavelength signals comprises a presence of two guard beam signals when only one guard beam signal was expected.

11. The system according to claim 9, wherein the determined change in the number of detected wavelength signals comprises a presence of only one guard beam signal when two guard beam signals were expected.

12. The system according to claim 9, wherein the first guard beam signal at the first wavelength and the second guard beam signal at the second wavelength are emitted at different times.

13. The system according to claim 9, wherein the first guard beam signal at the first wavelength and the second guard beam signal at the second wavelength are pulsed at different pulse rates.

14. The system according to claim 9, wherein the first guard beam signal at the first wavelength and the second guard beam signal at the second wavelength are produced at different intensity levels.

15. The system according to claim 9, wherein the plurality of emitters and the plurality of detectors are co-located near each other, with the emitted signals being reflected from reflective structures at an other end of the power beam back to the plurality of detectors.

16. A system to detect foreign objects that are approaching the power beam, comprising:
a plurality of emitters and a plurality of detectors that form a light curtain patterned about the power beam, the plurality of emitters surrounding the power beam having an emitter module including:
one or more first emitters arranged to modulate a first guard beam signal at a first wavelength, the first guard beam signal emitted in proximity to the power beam; and
one or more second emitter arranged to modulate a second guard beam at a second wavelength, wherein the first wavelength is different than the second wavelength, the second guard beam signal emitted in proximity to the first signal; and the plurality of detectors surrounding the power beam, the plurality of detectors including:
one or more first detectors arranged to detect a first guard beam signal emitted by the one or more first emitters at the first wavelength;
one or more second detectors arranged to detect a second guard beam signal emitted by the one or more second emitters at the second wavelength; and
a controller that directs operations of the one or more first detectors and the one or more second detectors, wherein the controller determines that an unexpected change in intensity of the detected guard beam signals is indicative of a foreign object near or impeding the power beam, and wherein the controller further generates a responsive signal that causes transmission of the power beam to be stopped in response to the determination of the unexpected change.

17. The system according to claim 16, wherein the determined change in intensity of the detected guard beam signals comprises an unexpected increase in an intensity of the detected guard beam signals.

18. The system according to claim 16, wherein the determined change in intensity of the detected guard beam signals comprises an unexpected decrease in an intensity of the detected guard beam signals.

19. The system according to claim 16, wherein the first guard beam signal at the first wavelength and the second guard beam signal at the second wavelength are emitted at different times.

20. The system according to claim 16, wherein the first guard beam signal at the first wavelength and the second guard beam signal at the second wavelength are pulsed at different pulse rates.

21. The system according to claim 16, wherein the first guard beam signal at the first wavelength and the second guard beam signal at the second wavelength are produced at different intensity levels.

22. The system according to claim 16, wherein the plurality of emitters and the plurality of detectors are co-located near each other, with the emitted signals being reflected from reflective structures at an other end of the power beam back to the plurality of detectors.

* * * * *